(12) United States Patent
Neumeister et al.

(10) Patent No.: US 9,206,919 B2
(45) Date of Patent: Dec. 8, 2015

(54) CORROSION AND DEPOSITION PROTECTED VALVE APPARATUS AND METHOD

(71) Applicant: MKS INSTRUMENTS, INC., Andover, MA (US)

(72) Inventors: David Neumeister, Loveland, CO (US); Bradly Lefevre, Lakewood, CO (US); Kevin Grout, Denver, CO (US); Youfan Gu, Superior, CO (US)

(73) Assignee: MKS Instruments, Inc., Andover, MA (US)

( * ) Notice: Subject to any disclaimer, the term of this patent is extended or adjusted under 35 U.S.C. 154(b) by 52 days.

(21) Appl. No.: 14/061,553

(22) Filed: Oct. 23, 2013

(65) Prior Publication Data
US 2014/0109973 A1    Apr. 24, 2014

Related U.S. Application Data

(60) Provisional application No. 61/717,469, filed on Oct. 23, 2012.

(51) Int. Cl.
| | |
|---|---|
| *F16K 51/02* | (2006.01) |
| *F16K 27/00* | (2006.01) |
| *F16K 41/10* | (2006.01) |
| *F16K 27/02* | (2006.01) |
| *C23C 16/44* | (2006.01) |

(52) U.S. Cl.
CPC .............. *F16K 27/00* (2013.01); *C23C 16/4412* (2013.01); *F16K 27/02* (2013.01); *F16K 41/10* (2013.01); *F16K 51/02* (2013.01); *Y10T 137/0318* (2015.04); *Y10T 137/7043* (2015.04); *Y10T 137/87877* (2015.04)

(58) Field of Classification Search
CPC ....... F16K 51/02; F16K 41/10; F16K 41/103; C23C 16/4412; Y10T 137/87877
See application file for complete search history.

(56) References Cited

U.S. PATENT DOCUMENTS

| | | | |
|---|---|---|---|
| 1,979,109 A | * | 10/1934 | Johnsson ..................... 236/99 R |
| 2,315,058 A | | 3/1943 | P.H. Holt, II. et al. |
| 3,625,474 A | | 12/1971 | Juede |
| 4,211,387 A | | 7/1980 | Getchell et al. |
| 4,482,091 A | * | 11/1984 | Lawsing ..................... 236/92 R |
| 4,711,270 A | | 12/1987 | Fornasari |
| 5,597,009 A | | 1/1997 | Scherrer et al. |
| 5,893,707 A | | 4/1999 | Simmons et al. |
| 5,915,410 A | | 6/1999 | Zajac |
| 6,478,043 B2 | | 11/2002 | Ishigaki |
| 6,805,152 B2 | | 10/2004 | Kanzaka et al. |

(Continued)

OTHER PUBLICATIONS

International Search Report PCT/US2013/086328; Oct. 23, 2013; 10 pages.

*Primary Examiner* — John Fox
(74) *Attorney, Agent, or Firm* — James R. Young; Cochran Freund & Young LLC

(57) ABSTRACT

An expandable and contractible shield around a bellows in a valve protects the bellows from corrosive gases and solid particles in the valve chamber. In a manifold valve assembly with multiple outlet ports and multiple valves in a common valve chamber, a respective expandable and contractible shield around each respective bellows of each respective valve in the assembly separates each bellows from corrosive gases and solid particles in the common valve chamber regardless of whether one or all of the valves in the assembly is opened or closed.

21 Claims, 19 Drawing Sheets

(56) References Cited

U.S. PATENT DOCUMENTS

| | | |
|---|---|---|
| 7,011,295 B2 * | 3/2006 | Kajitani ................. 251/335.3 |
| 7,481,417 B2 * | 1/2009 | Mayer et al. ............... 251/158 |
| 8,196,893 B2 | 6/2012 | Grout et al. |
| 2003/0178064 A1 | 9/2003 | Fukuda et al. |
| 2006/0266962 A1 | 11/2006 | Kanzaka et al. |
| 2007/0090095 A1 | 4/2007 | Yoshida et al. |
| 2008/0111095 A1 | 5/2008 | Naitoh et al. |
| 2008/0185062 A1 | 8/2008 | Johannes Nijland |
| 2012/0126159 A1 | 5/2012 | Lee |

* cited by examiner

CORROSION AND DEPOSITION PROTECTED VALVE APPARATUS AND METHOD

PRIORITY CLAIM

This application claims priority to the U.S. provisional application No. 61/717,469 filed on Oct. 23, 2013, which is incorporated herein by reference.

BACKGROUND

1. Field of the Invention

This invention is related to fluid control valves and more specifically to corrosion and deposition protected valve apparatus and methods.

2. State of the Prior Art

Valves are used in myriad applications in which corrosive gases or precursors of various kinds have to flow through them. In some applications, for example, in some chemical vapor deposition (CVD) systems, certain valves have to handle different materials that are themselves corrosive and/or reactive and which tend to attack internal metal and other components of valves or which cross-react with each other to deposit solid by-products in the valves and other piping and system components. Such corrosion or solid depositions can shorten valve service lifetimes and cause excessive and expensive shut-downs and repairs in CVD systems.

To avoid or at least minimize such unwanted corrosion and/or deposition, the valves, piping, and other components are often made with stainless steel or other corrosion resistant materials and are heated in order to maintain their temperatures high enough to vaporize any materials that start to condense on their surfaces or to prevent reactions that, at lower temperatures, may form byproducts which would deposit on the surfaces. Some valves, for example isolation valves, which are sometimes used in forelines of CVD systems, i.e., between the CVD reaction chamber and the vacuum pump, use flexible stainless steel bellows to isolate the vacuum in the valve chamber from the atmospheric pressure in the valve actuator apparatus. However, such bellows are generally made of thin stainless steel or other metal in order to be flexible enough to accommodate the reciprocal motion of the valve actuator apparatus as the valve opens and closes, and such thin material, even though it is stainless steel, is vulnerable to chemical attack and corrosion from corrosive gases flowing through the valve chamber. Also, some solid by-products, e.g., silicon dioxide, have high melting temperatures and may not be sublimated. Deposition of such solid materials on the bellows surface generates a significant amount of particles, which not only is a source of unwanted contamination in the CVD system, but can also affect the mechanical strength of the bellows.

To address these problems, the isolation valve in U.S. Pat. No. 8,196,893, which is incorporated herein by reference for all that it discloses, provides a protective cup around the bellows to isolate the bellows from the valve chamber when the valve is open to allow flow of gases through the valve. While that protective cup in U.S. Pat. No. 8,196,893 is generally effective for protecting the bellows in some applications, it does not isolate the bellows from the valve chamber when the valve is closed. Therefore, it would not be effective, for example, to protect the bellows in situations where two or more of the valve actuator and closure apparatus are placed together in a common valve chamber or manifold such that the bellows of a closed valve is exposed to corrosive gases flowing through the common valve chamber or manifold with an open valve.

The foregoing examples of related art and limitations related therewith are intended to be illustrative, but not exclusive or exhaustive, of the subject matter. Other aspects and limitations of the related art will become apparent to those skilled in the art upon a reading of the specification and a study of the drawings.

SUMMARY

The following embodiments and aspects thereof are described and illustrated in conjunction with systems, tools and methods which are meant to be examples and illustrative, not limiting in scope. In various embodiments and implementations, one or more of the above-described problems have been reduced or eliminated, while other embodiments are directed to other improvements and benefits.

Protection from corrosive gas or deposition, e.g., particles or other solid material deposition or build-up, is provided for bellows in a valve in which such bellows are provided to isolate a valve chamber in a vacuum-tight manner from components of valve actuator apparatus that may be exposed to atmospheric or some other different pressure than the pressure in the valve chamber, especially, but not only, in manifold valve assemblies in which a plurality of such valves with such bellows are assembled in a common valve chamber to selectively open and close one or more of a plurality of outlet ports in the common valve chamber. Such valves, whether plural and implemented in such a manifold valve assembly or single and implemented in a valve chamber with a single outlet, may have a valve chamber enclosed by a valve body with an inlet port and an outlet port that accommodates fluid flow through the valve chamber from the inlet port to the outlet port, a closure member in the valve chamber that is movable between an open position and a closed position, an actuator connected to the closure member for moving the closure member between closed and open positions, and a bellows separating the actuator or parts of the actuator from the valve chamber with a vacuum-tight seal so as to maintain a vacuum in the valve chamber regardless of the atmospheric or other pressure conditions in the actuator or parts of the actuator.

For example, a valve apparatus may comprise a valve body enclosing a valve chamber, wherein said valve body has an inlet port and at least one outlet port. In a manifold valve assembly, there could be more than one outlet port. A closure member is provided for each outlet port and is positioned in the valve chamber between the inlet port and a respective outlet ports and is movable back and forth between (i) an open position in which the closure member allows fluid in the valve chamber to flow through the outlet port and out of the valve chamber and (ii) a closed position in which the closure member prevents fluid flow through the outlet port. Actuator apparatus for each closure member is provided for moving the closure member reciprocally between the open position and the closed position. The actuator apparatus may be of a type comprising a piston for applying a force to move the closure member to the opened position, a spring for applying a force to move the closure member to the closed position, and a bellows positioned to isolate the valve chamber and is impervious to air or gas to provide a vacuum-tight seal from the piston cylinder, piston, and other components that may not operate at the same pressure as the valve chamber. An expandable and contractible shield is positioned in the valve chamber in a manner such that at least the bellows of each actuator apparatus is surrounded by an expandable and contractible shield in a manner that separates at least the bellows from gases flowing in the valve chamber, thereby protecting the bellows from particles or corrosive gas that may be in the gases flowing in the valve chamber or from deposition of solid material from gases flowing in the valve chamber. The expandable and contractible shield encloses a space in which a bellows is positioned so that a fluid flowing through the valve chamber to one or more of the outlet ports is precluded by the shield from contact with the bellows. The expandable and contractible shield protects the bellows in the space enclosed by the bellows regardless of whether the actuator or the valve closure member is in the open position or the closed position. Therefore, the bellows associated with a particular one of the valve closure members and its associated actuator is always protected from a fluid flow in the valve chamber, even if that particular valve closure member is closed while another one of the valve closure members associated with another one of the outlet ports is open and allowing fluid to flow through the valve chamber.

In one example embodiment, the expandable and contractible shield may comprise a stationary shield section that extends from a portion of the valve body around the bellows toward but not all the way to the closure member, and a movable shield section that extends from the closure member or from a connection adjacent to the closure member, for example, from the valve stem, to interface in a movable manner with an outside surface or an inside surface of the stationary shield section and such that the movable shield section is movable reciprocally in relation to the stationary shield section. A space enclosed by the shield around the bellows may be, but does not have to be, pressurizable with gas, for example, with an inert gas, to a pressure higher than a pressure in the valve chamber outside of the shield to inhibit fluid in the valve chamber that is outside the shield from flowing or seeping into the space enclosed by the shield in which the bellows is positioned.

In an example embodiment, there may be an annular opening between juxtaposed annular surfaces of the stationary shield section and the movable shield section, and the space enclosed by the shield around the bellows may be pressurizable with a sufficient pressure and volume of gas to create an annular jet flow of gas from the space inside the shield and through the annular opening to the valve chamber outside of the shield. As a further example, a guide ring may be positioned between the stationary and movable shield sections. As a further example, the guide ring may include a plurality of bosses that slide on an interfacing surface of one of the shield sections. In one example implementation, the guide may provide a gap that forms an annular nozzle between an annular surface of the guide ring and the adjacent juxtaposed annular surface of the shield section.

In another example embodiment, the actuator apparatus for each of the closure members may include motive apparatus connected to the closure member and a bellows that surrounds the motive apparatus and is sealed vacuum-tight between the manifold valve body and the closure member to isolate the motive apparatus from the manifold valve chamber, and wherein the shield isolates the bellows from the manifold valve chamber to prevent contact between the bellows and fluid flowing through the manifold valve chamber. In another example implementation, the manifold valve body may terminate at the top with a bonnet. An example motive apparatus may include: (i) a cylinder housing mounted on the bonnet; (ii) a piston slidably mounted in the cylinder housing; (iii) a piston rod that extends from the piston in the cylinder housing, through an aperture in the bonnet, and to the closure member; and a spring positioned to apply a force on the closure member in opposition to the piston when pneumatic pressure is applied to the piston.

In another example embodiment, a valve body encloses a valve chamber, wherein said valve body has an inlet port for flow of fluid into the valve chamber and at least one outlet port for flow of fluid out of the valve chamber. The example embodiment may include a closure member positioned in the valve chamber between the inlet port and the outlet port, wherein the closure member is movable back and forth between (i) an open position in which the closure member allows fluid flow from the inlet port and through the outlet port out of the valve chamber and (ii) a closed position in which the closure member prevents fluid flow through the outlet port. The example embodiment may also include actuator apparatus comprising a piston for applying a force to move the closure member to the opened position, a spring for applying a force to move the closure member to the closed position, and a bellows positioned to isolate the piston with a vacuum-tight seal from the valve chamber. An expandable and contractible shield is positioned around at least the bellows in a manner that separates the bellows from gases flowing in the valve chamber. The shield in such an example embodiment may comprise a stationary shield section that extends from a portion of the valve body around the actuator apparatus toward but not all the way to the closure member, and a movable shield section that extends from the closure member to interface in a movable manner with the outside or the inside of the stationary shield section and such that the movable shield section is movable reciprocally in relation to the stationary shield section. A space enclosed by the shield around the bellows may be pressurizable with an inert gas to a pressure higher than a pressure in the valve chamber outside of the shield to prevent flow or seepage of gas or particles in a gas from the valve chamber outside of the shield into the space enclosed by the shield to protect the bellows in the space enclosed by the shield from gas in the valve chamber that may be corrosive to the bellows or from deposition of solid material from gases or particles borne by gas in the valve chamber that might otherwise deposit on the bellows. An annular opening between juxtaposed surfaces of the stationary shield section and the movable shield section can be an annular nozzle for creating an annular jet flow of inert gas along an outside surface of the shield, e.g., an outside surface of the stationary shield section or an outside surface of the movable shield section, by pressurizing the space enclosed by the shield with a sufficient pressure and volume of inert gas to create such an annular jet flow of inert gas through the annular nozzle. A guide ring may be positioned between the stationary and movable shield sections. In one example, such a guide ring may include a plurality of bosses that slide on an interfacing surface of one of the shield sections. In another example or in the same example, the guide ring can provide a gap that forms an annular nozzle between an annular surface of the guide ring and the adjacent juxtaposed surface of the shield section.

In a valve that has a valve chamber enclosed by a valve body with an inlet port and an outlet port that accommodates fluid flow through the valve chamber from the inlet port to the outlet port, a closure member in the valve chamber that is movable between an open position and a closed position, an actuator connected to the closure member for moving the closure member between closed and open positions, and a bellows separating the actuator from the fluid flow chamber with a vacuum-tight seal to the closure member and to the valve body, an example method of protecting the bellows from particles, solid deposition, or corrosion from gas flow through the valve chamber may comprise preventing the gas that flows through the valve chamber from entering a space in the valve chamber in which the bellows is positioned by providing an expandable and contractible shield around the space in which the bellows is positioned. In one example embodiment, the method may include positioning the expandable and contractible shield in a position in the valve chamber that encloses the space in which the bellows is positioned such that the expandable and contractible shield and does not inhibit the fluid flow outside of the expandable and contractible shield from the inlet port to the outlet port. One example method of protecting the bellows in such valve apparatus may include pressurizing the space inside the expandable and contractible shield in which the bellows is positioned to have a higher pressure than the valve chamber outside of the expandable and contractible shield to prevent fluid outside of the shield from flowing or seeping into the space enclosed by the shield. An example method of protecting the bellows in such valve apparatus may also include providing the expandable and contractible shield by extending a stationary shield portion from a portion of the valve body around the actuator toward but not all the way to the closure member and extending a movable shield portion from the closure member toward but not all the way to the portion of the valve body around the actuator and in telescopically sliding relation to the stationary shield portion so that movement of the closure member toward and away from the outlet port causes expansion and contraction, respectively, of the expandable and contractible shield by moving the movable shield portion reciprocally in relation to the stationary shield portion. An example method of protecting the bellows in such valve apparatus may also include positioning the movable shield portion outside of the stationary shield portion such that an inside surface of the movable shield portion slides along an outside surface of the stationary shield portion, or the method may include positioning the movable shield portion inside of the stationary shield portion such that an outside surface of the movable shield portion slides along an inside surface of the stationary shield portion. Optional pressurization of the space inside the expandable and contractible shield with a flow of gas, for example, an inert gas or air, may prevent flow or seepage of gas that may be corrosive, laden with particles, or other harmful deposition effects from outside of the shield to the space inside of the shield. One example method may include providing an annular gap between the movable shield portion and the stationary shield portion to create an annular jet of the inert gas or air flowing from the annular gap adjacent respective juxtaposed surfaces of the movable shield portion and the stationary shield portion to blow particles, gas that may deposit solid material, or corrosive gas in the fluid flow in the valve chamber away from one or more of the respective outside surfaces of the movable shield portion and the stationary shield portion.

In addition to the example aspects, embodiments, and implementations described above, further aspects, embodiments, and implementations will become apparent to persons skilled in the art after becoming familiar with the drawings and study of the following descriptions.

BRIEF DESCRIPTION OF THE DRAWINGS

The accompanying drawings, which are incorporated herein and form a part of the specification, illustrate some, but not the only or exclusive, example embodiments and/or features. It is intended that the embodiments and figures disclosed herein are to be considered illustrative rather than limiting.

DETAILED DESCRIPTION OF EXAMPLE EMBODIMENTS

Figure 1:
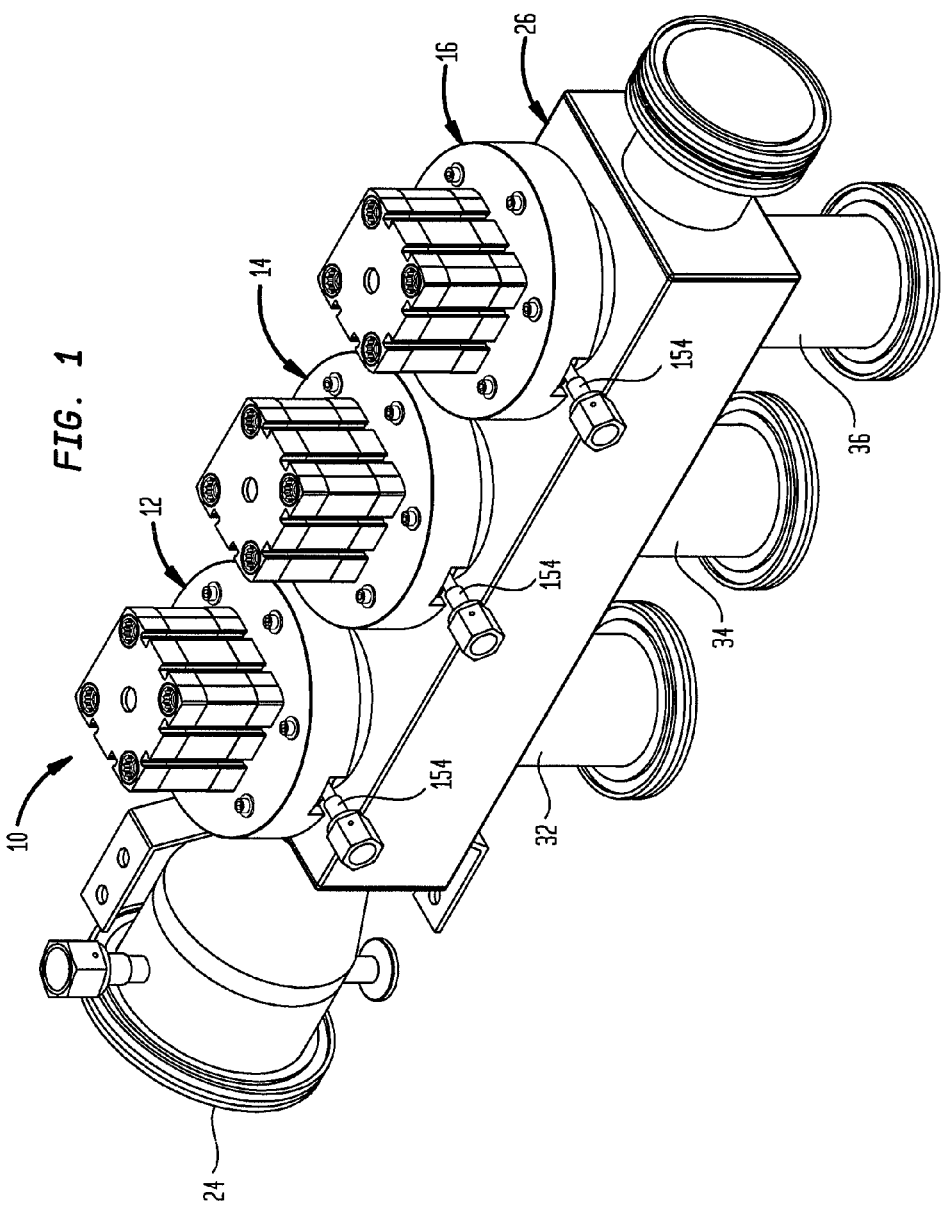
FIG. 1 is an isometric view of an example manifold mounted isolation valve assembly in which a plurality of example isolation valves positioned in a common valve chamber are equipped with corrosion and deposition protected valve actuator and closure apparatus.
Figure 2:
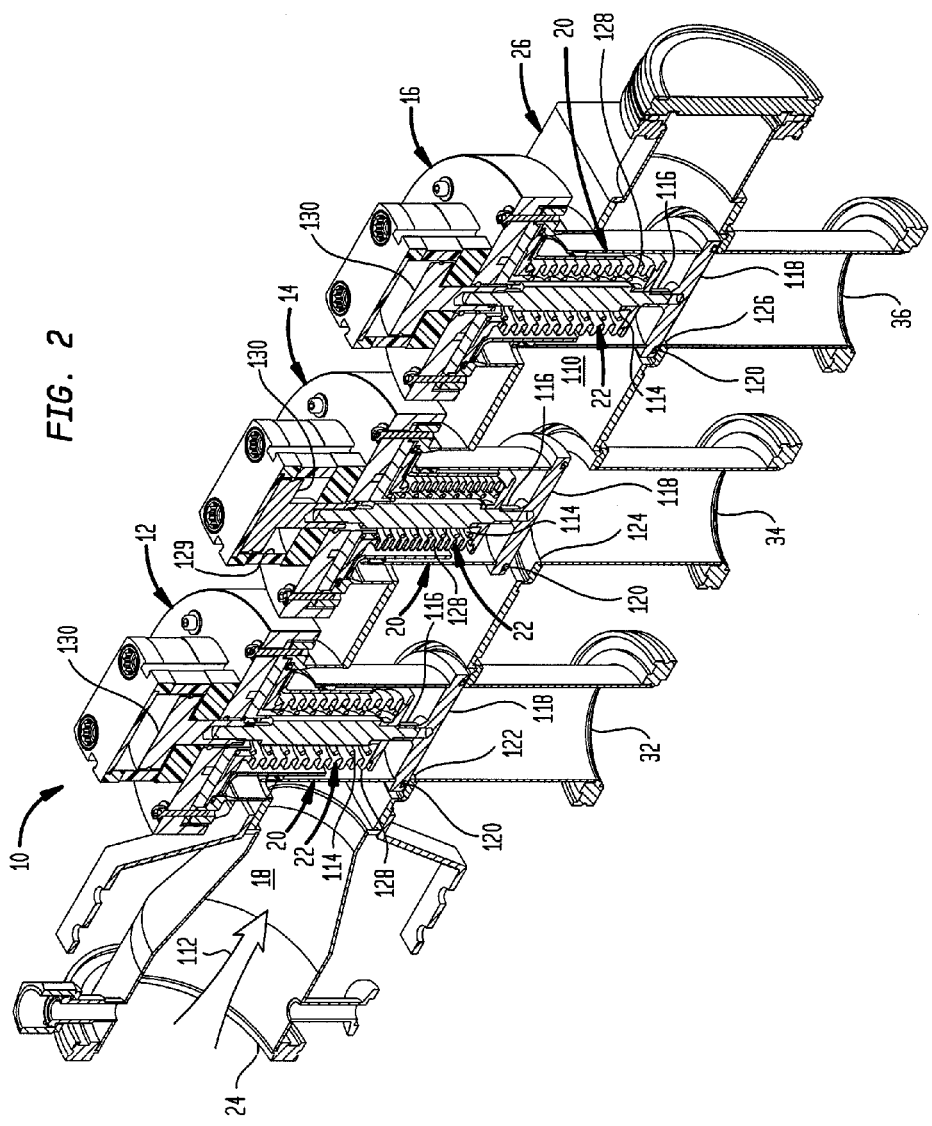
FIG. 2 is a longitudinal isometric cross-section view of the example manifold mounted isolation valve assembly in FIG. 1.
Figure 3:
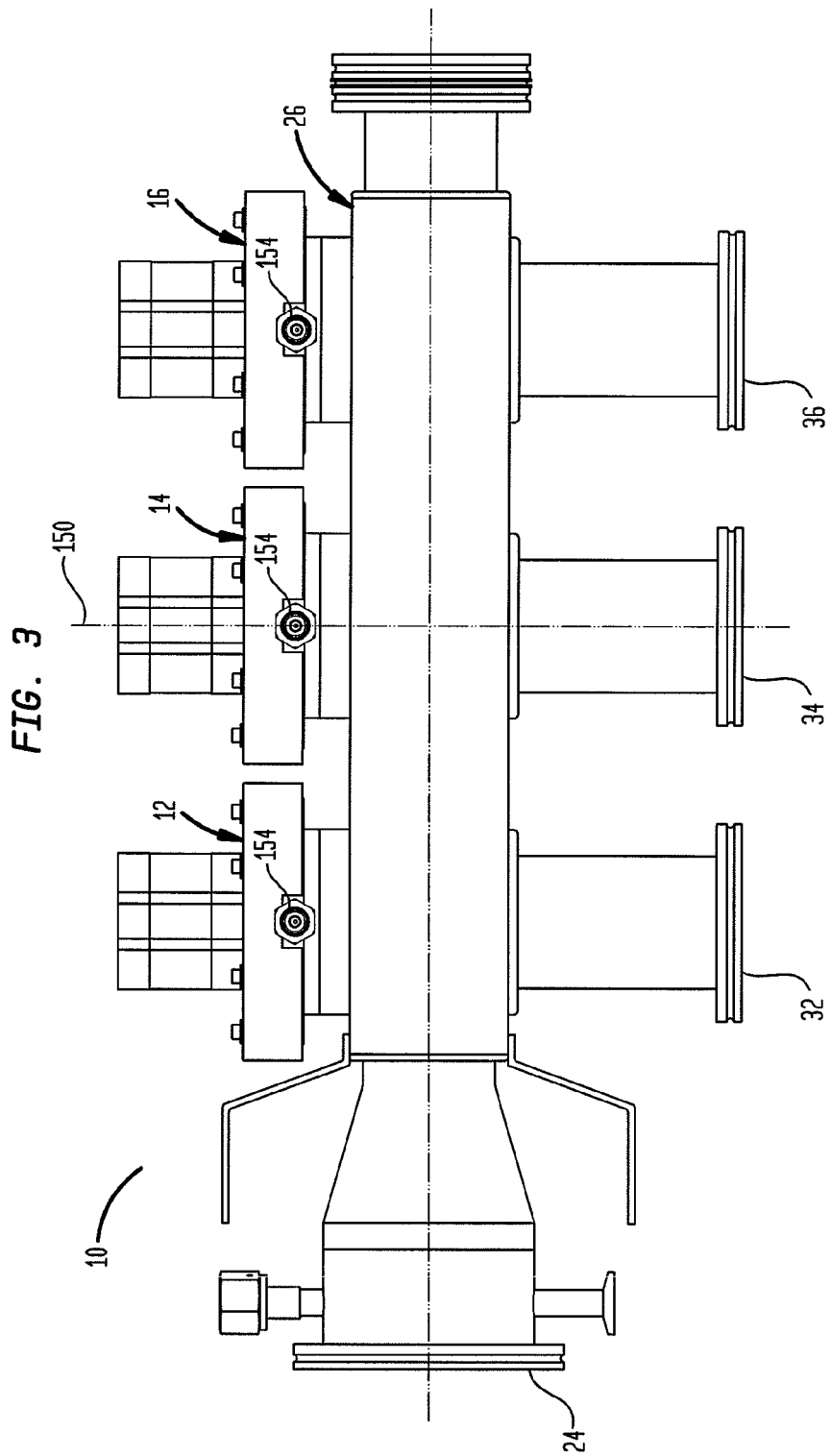
FIG. 3 is a side elevation view of the example manifold mounted isolation valve assembly in FIG. 1.
Figure 4:
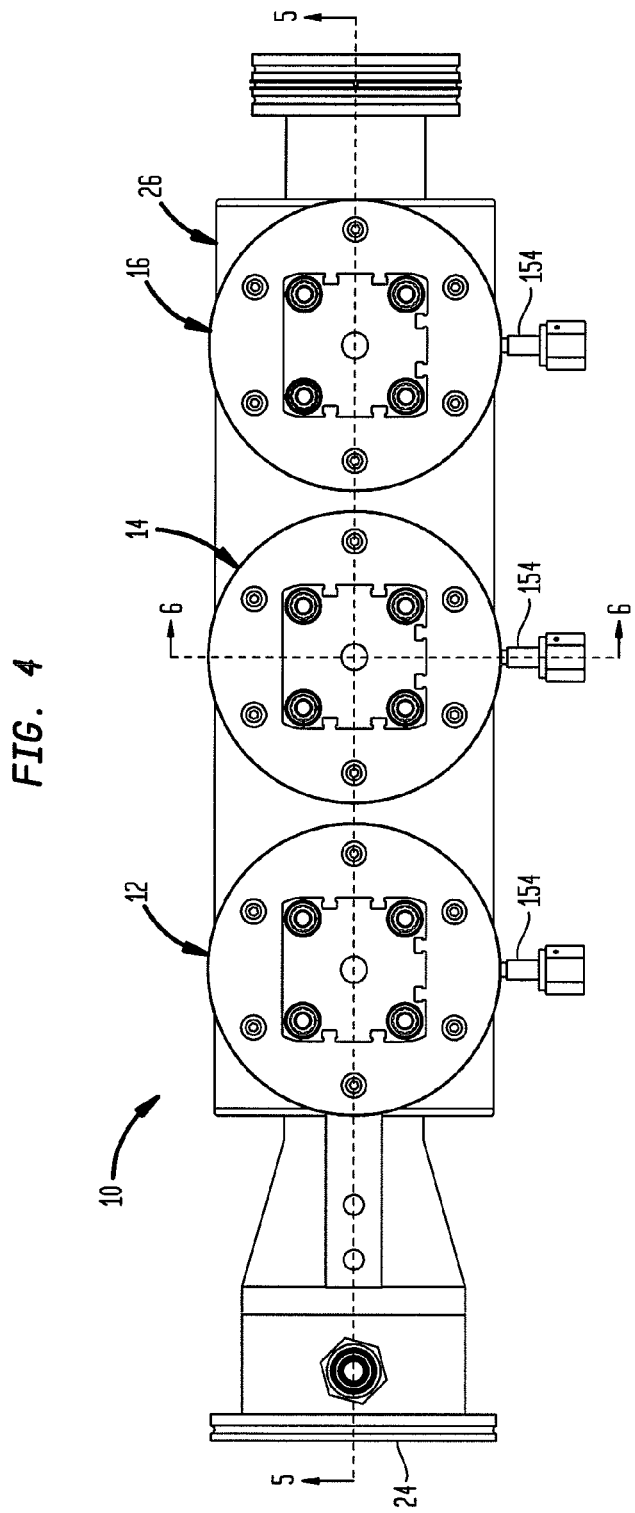
FIG. 4 is a top plan view of the example manifold isolation valve assembly in FIG. 1.

An example manifold isolation valve assembly 10 is shown in FIGS. 1 and 2 with a plurality of example isolation valves 12, 14, 16 mounted in a fluid flow channel 18 of a manifold 26 such that part or all of the manifold 26 provides a common valve body enclosing part or all of the fluid flow channel 18 as a common valve chamber 110 for the plurality of isolation valves 12, 14, 16. Each of the isolation valves 12, 14, 16 is equipped with a corrosion and deposition protected valve actuator apparatus 22 (see FIG. 2) for opening and closing a valve closure member 118 to allow or preclude a fluid flow 112 from an inlet port 24 through one or more of a plurality of outlet ports 32, 34, 36. Each isolation valve 12, 14, 16 opens and closes a respective outlet port 32, 34, 36, as will be described in more detail below. The valve actuator apparatus 22 in the example manifold isolation valve assembly 10 includes motive apparatus comprising, for example, a compression spring 112 for closure actuation and a piston 130 for opening actuation. A bellows 128 in the valve chamber 110 isolates the fluid flow channel 18 with a vacuum-tight seal from atmospheric or other pressure in the motive apparatus and other components of the valve actuator apparatus 22 as will be described in more detail. An expandable and contractible corrosion shield 20 surrounds and protects the bellows 128, e.g., from corrosion and deposition, as will also be described in more detail below.

An example single valve embodiment 200 with the corrosion and deposition protected valve actuator apparatus 22 is shown in FIGS. 9-17. Since the corrosion and deposition protected valve actuator apparatus 22 and a number of other components and features of the example single valve embodiment 200 are or can be the same or sufficiently similar to those components of the isolation valves 12, 14, 16 in the manifold mounted isolation valve assembly 10 and vice versa, it is convenient to illustrate and describe some of such components and details in reference to the single valve embodiment 200, with the understanding that they also apply to the multiple isolation valves 12, 14, 16 in the manifold mounted isolation valve assembly 10 as will be understood by persons skilled in the art. Therefore, for convenience and to avoid clutter, the example isolation valves 12, 14, 16 shown in FIGS. 1-6 do not include all of the components and details that are shown more completely in the single valve embodiment 200 in FIGS. 8-17, but with the understanding that such components and details that are shown in the single valve embodiment 200 may also be employed in the example isolation valves 12, 14, 16. Of course, other components and details can also be designed and implemented by persons skilled in the art to perform the operative functions of the example isolation valves described herein, once they understand the principles of the invention. Also, while the example manifold isolation valve assembly 10 in FIGS. 1-6 is illustrated with three isolation valves 12, 14, 16 mounted in the manifold 26, there could be any plurality of such isolation valves mounted in the manifold 26.

Referring now primarily to FIGS. 1 and 2, each of the plurality of isolation valves, e.g., the example isolation valves 12, 14, 16, are mounted in the manifold 26 either allow or preclude flow of fluid from an inlet port 24, through the fluid flow chamber 18, and out one or more of a plurality of outlet ports, e.g., the outlet ports 32, 34, 36. Each isolation valve 12, 14, 16 opens and closes a respective outlet port 32, 34, 36, as will be described in more detail below.

Figure 7:
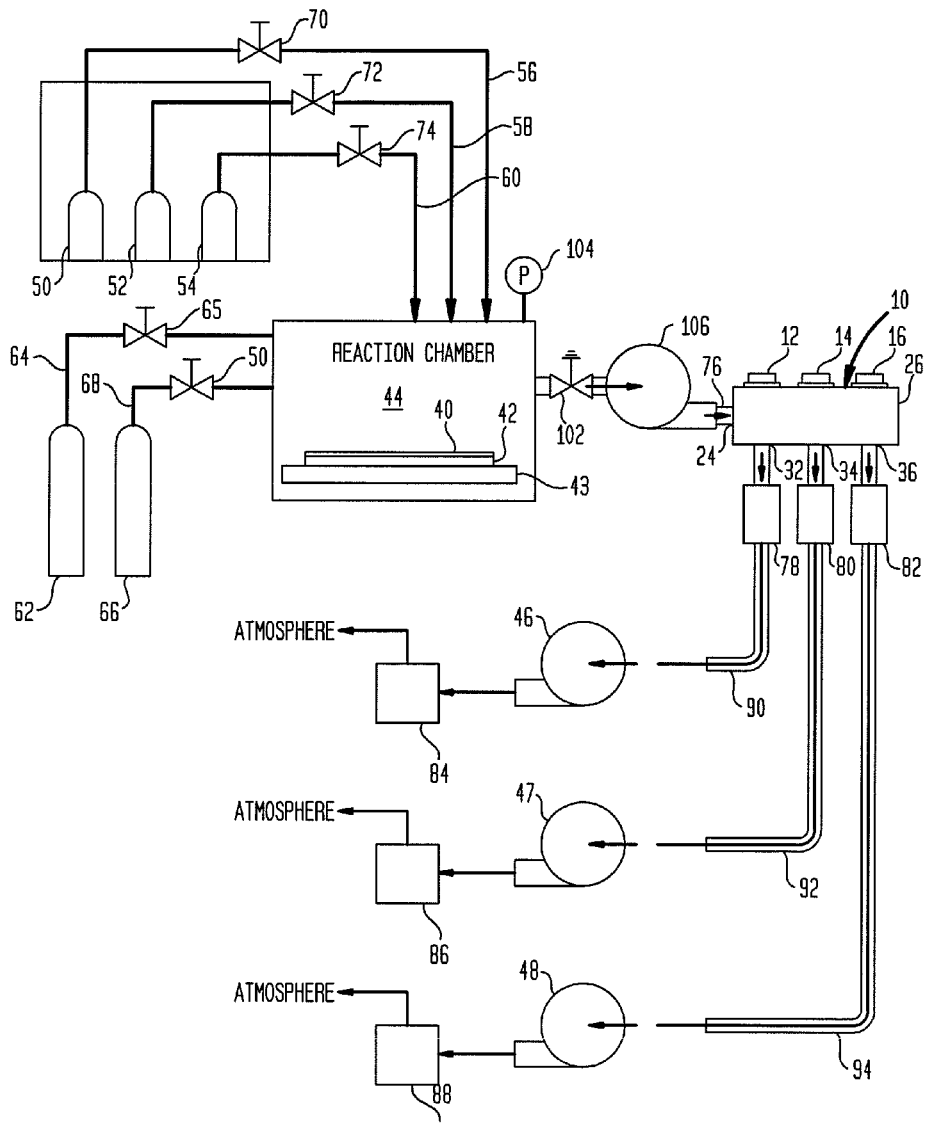
FIG. 7 is a schematic diagram of an example chemical vapor deposition (CVD) system in which a ganged assembly of isolation valves, such as the example isolation valve assembly in FIG. 1, can be used.
Figure 8:
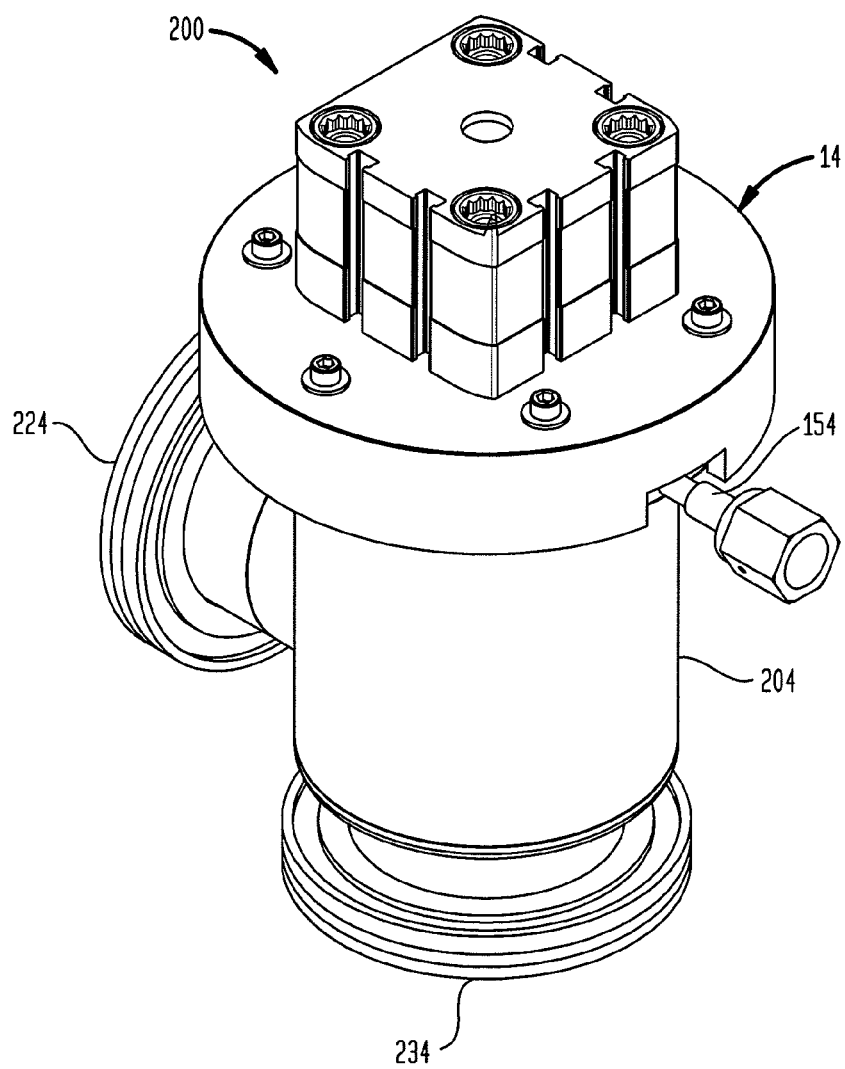
FIG. 8 is an isometric view of an example single isolation valve embodiment equipped with the same example corrosion and deposition protected valve actuator and closure apparatus as the multiple isolation valves in FIGS. 1-6.

A schematic diagram in FIG. 7 illustrates the manifold mounted isolation valve assembly 10 in a chemical vapor deposition (CVD) system as one example application in which the protection provided by the expandable and contractible sleeve 20 is beneficial for prolonging the useful life of the bellows 128. In the CVD system illustrated in FIG. 7, a thin film coating of material 40 is deposited on a wafer 42 in a CVD reaction chamber 44, which is evacuated by one or more of a plurality of vacuum pumps, e.g., vacuum pumps 46, 47, 48, depending on the nature of the gases being handled at a particular time or operation as explained below. One or more feed gases comprising one or more reaction constituents are flowed from feed gas containers, e.g., feed gas containers 50, 52, 54, through respective reactant feed gas flow lines 56, 58, 60 into the reaction chamber 44, where they react with each other and/or are dissociated in plasma to form the desired thin film or films 40 on the wafer 42. An inert carrier or dilution gas from an inert or carrier gas source container 62 may be flowed via a carrier gas flow line 64 through the reaction chamber 44 during the CVD reactions or after the reactions are stopped. Also, an etchant gas, for example, from a source container 66 is sometimes also provided for etching or for in situ cleaning. Control valves 65, 69, 70, 72, 74 facilitate controlling the inert and reactive gas flows. The reaction byproducts, unreacted feed gases, and/or inert carrier or dilution gases as well as the etchant gases and gaseous products of etch reactions are drawn as effluent out of the chamber 44 by one or more of the vacuum pumps via a foreline 76. In the example CVD system illustrated in FIG. 7, three vacuum pumps 46, 47, 48 are used, as will be described below, so there are three branch portions 90, 92, 94 of the foreline 76 that connect the respective vacuum pumps 46, 47, 48 to the reaction chamber 44.

The example manifold isolation valve assembly 10 with its isolation valves 12, 14, 16 is shown schematically in the example CVD system in FIG. 7 mounted in the foreline 76 to receive the effluent flow from the reaction chamber 44 in the inlet port 24 of the manifold 26 of the assembly. The three outlets 32, 34, 36 of the manifold 26 are connected to the branch portions 90, 92, 94, respectively, of the foreline 76 to direct the effluent flow from the reaction chamber 44 to one or more of the vacuum pumps 46, 47, 48. The pressure in the reaction chamber 44 can be monitored in the chamber 44 by any of a variety of pressure measuring or reading devices e.g., the pressure gauge 104, and it can be controlled by a pressure control valve in the foreline 76, e.g., the pressure control valve 102 in the foreline 76 illustrated in FIG. 7. Also, an auxiliary pump 106, such as a roots pump or a turbine pump, may be installed in the foreline 76 upstream from the manifold 26 to facilitate faster evacuation of the reaction chamber 44 and to attain lower pressures in the reaction chamber 44. One or more optional traps, e.g., traps 78, 80, 82, can be provided in one or more of the branch portions 90, 92, 94 of the foreline 76 to remove reactant and reaction byproduct gases, byproduct particles, or etchant gases before they reach the vacuum pumps 46, 47, 48. One or more scrubber apparatus, e.g., scrubbers 84, 86, 88, may be provided downstream from the vacuum pumps 46, 47, 48 to remove harmful chemicals from the effluent gas flows before any remaining effluent is exhausted into the atmosphere. Some kind of isolation valve is commonly positioned in the foreline 76 downstream from the reaction chamber 44 to isolate the reaction chamber 44 from the atmosphere and from other contaminants when components downstream, such as a vacuum pump, trap, filters, or other components have to be removed for maintenance, repair, or replacement. Any of a variety of other CVD equipment or components known to persons skilled in the art, but which not necessary for an understanding of the functions and benefits of the manifold isolation valve assembly 10, may also be included but are not shown in FIG. 7.

The example manifold isolation valve assembly 10 shown in FIGS. 1-6 is particularly useful in CVD systems, such as the example CVD system illustrated schematically in FIG. 7, that are designed to handle effluents comprising different constituent gases with different scrubbers, e.g., scrubbers 84, 86, 88, and/or optionally different traps, e.g., traps 78, 80, 82, each of which is designed to remove one or more particular effluent gas constituents effectively, but which may not remove other particular effluent gas constituents effectively. For example, during a CVD process step that uses a first particular feed gas which can be recovered from the effluent efficiently by the first scrubber 46, the first isolation valve 12 in the manifold isolation valve assembly 10 may be opened and the other two isolation valves 14, 16 may be closed in order to direct the effluent flow through the first outlet port 32 to the first scrubber 84 for recovery of that first feed gas. Then, when the next step in the CVD process uses a second particular feed gas that can be recovered from the effluent with the second scrubber 48, the first and third isolation valves 12, 16 may be closed and the second isolation valve 14 may be opened to direct the effluent to the second scrubber 86. Similarly, for recovering a third gas constituent from the effluent with the third scrubber 88, the first and second isolation valves 12, 14 may be closed and the third isolation valve 16 may be opened to direct the effluent flow to that third scrubber 88.

Figure 5:
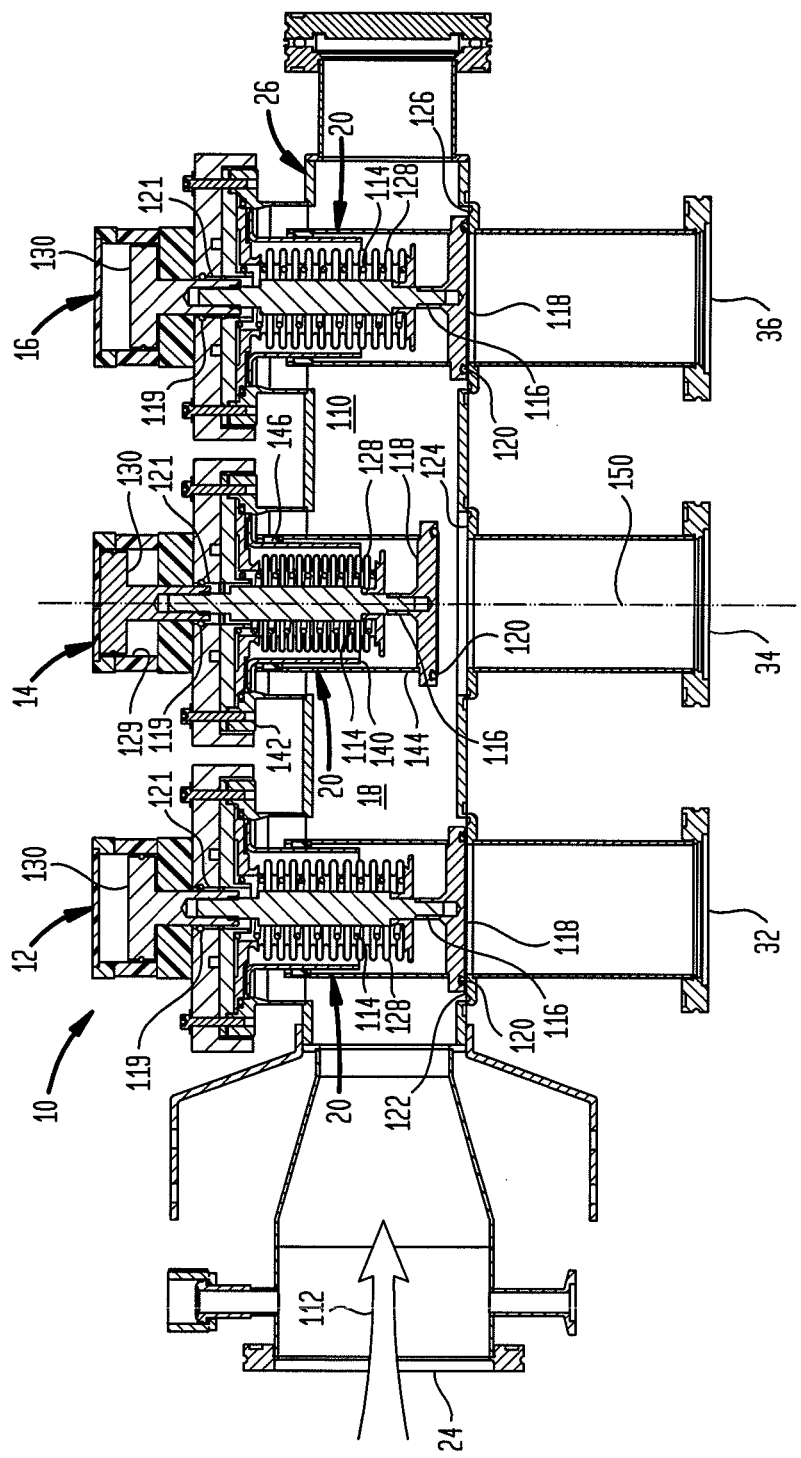
FIG. 5 is a cross-section view of the example manifold isolation valve assembly taken along the longitudinal section line 5-5 in FIG. 4 showing the middle isolation valve in the manifold assembly in open mode and both of the end isolation valves in closed mode to illustrate the corrosion and deposition protection of the bellows and other valve actuator components of the isolation valves in both open and closed modes in a common valve chamber.

Referring now primarily to FIGS. 2 and 5, it can be seen that an effluent gas that flows into the valve chamber 110 of the manifold 26 via the inlet port 24, as indicated by the flow arrow 112, it can be directed to flow out of any of the three outlets 32, 34, 36 by opening and closing the respective isolation valves 12, 14, 16, because the valve chamber 110 in the manifold 26 is common to all of the isolation valves 12, 14, 16 and to all of the outlets 32, 34, 36. In FIGS. 2 and 5, the middle isolation valve 14 is illustrated, for example, in the open mode, while the end isolation valves 12, 14 are both illustrated, for example, as being in the closed mode. Of course, any combination of the isolation valves 12, 14, 16 can be opened or closed at any time, or they can all be closed or all opened.

Figure 6:
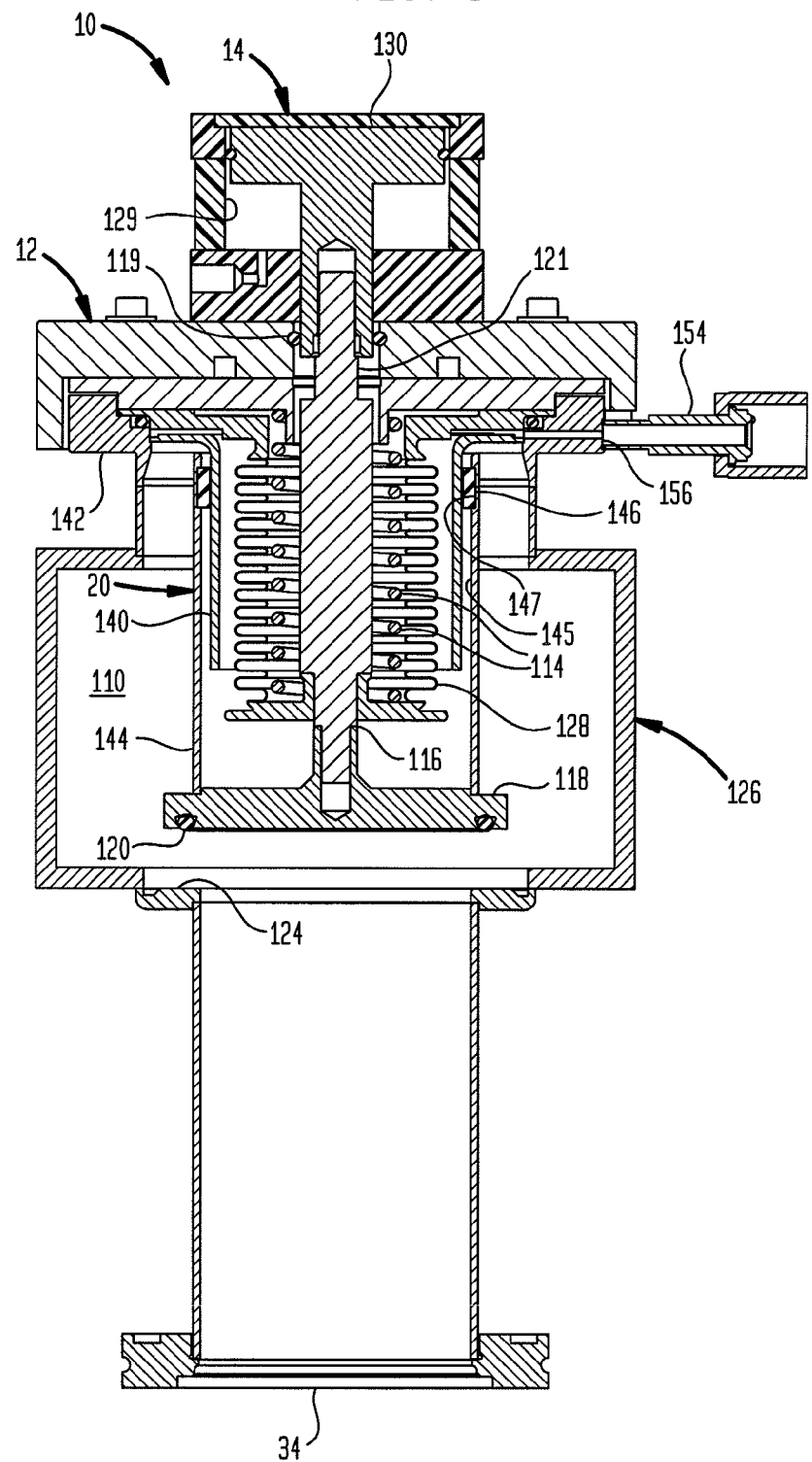
FIG. 6 is a cross-section view of the example manifold isolation valve assembly taken along the transverse section line 6-6 in FIG. 4 through the middle isolation valve in the assembly.

The example isolation valves 12, 14, 16, are all the same, so some particular respective components of those valves are numbered the same in this description for simplicity and to avoid unnecessary redundancy. In each of the example isolation valves 12, 14, 16, a piston 130 is connected by a valve stem 116 to the closure member 118 for moving the closure member 118 away from the respective valve seat 122, 124, 126 to thereby open a respective outlet opening 32, 34, 36. A compression spring 114 applies a force on the valve stem 116 to push the valve closure member 118 and valve seal 120 onto the valve seat 122, 124, 126 of the respective isolation valve 12, 14, 16 to close such respective isolation valve 12, 14, 16. As illustrated by the middle isolation valve 14, which is representative of all of the isolation valves 12, 14, 16 in the example manifold isolation valve assembly 10, to open the middle outlet port 34, pressurized air is forced into the pneumatic piston cylinder 129 of the isolation valve 14 under the piston 130 to apply enough pressure on the piston 130 to overcome the compression force of the spring 114 on the valve stem 116 and closure member 118 and thereby lift the valve closure member 118 away from the middle valve seat 124. Of course, releasing the pressurized air from under the piston 130 removes the lift force applied by the piston 130 on the valve stem 116, which allows the spring 114 to close the valve closure member 118 and valve seal 120 onto the valve seat 122, 124, 126. Persons skilled in the art understand that a gas other than air can also be used for such pneumatic piston operation. One or more seals, for example, the O-ring seals 119 around the valve stems 116 in FIGS. 5 and 6, provide a seal against leakage of the pressurized air or other gas from the pneumatic piston cylinders 129. In the example manifold isolation valve assembly 10, the valve stem 116 slides upwardly and downwardly in a reciprocal manner through the O-ring seal 119 as the isolation valve opens and closes as described above.

In a typical application, for example, in the CVD system in FIG. 7, the common valve chamber 110 in the manifold 26 (FIGS. 1, 2, 5, and 6) is evacuated along with evacuation of the reaction chamber 44, foreline 76, and other CVD system components by one or more of the vacuum pumps 84, 86, 88 (FIG. 7) to a low pressure that is less than atmospheric pressure, i.e., has a vacuum, during some or all of typical CVD processes. Such vacuums are often very low pressures, which require significant vacuum pumping capacity and efficiency to achieve and maintain, so it is desirable to prevent leaks of air or other gas into the evacuated system components, including the fluid flow channel 18 (FIGS. 1 and 2), to achieve and maintain the vacuum and to maximize vacuum pumping efficiency. Also, leakage of air or other gas from the pneumatic piston cylinder 129 into the foreline components, including the flow channel 18 of the manifold isolation valve assembly 10, risks migration of such air or other gas upstream into the reaction chamber 44, where it may contaminate the reaction chamber 44 and the thin films 40 produced in the reaction chamber 44. The O-ring seals 119 around the valve stem 116 are effective for the pneumatic operation of the piston 130 as they cause the valve stems 121 and closure members 118 to reciprocate up and down to open and close the valves 12, 14, 16, but they are not adequate or effective to seal against a significant vacuum in the fluid flow channel 18 of the manifold 26. Therefore, a bellows 128 (FIGS. 2 and 5), which is impervious to air and other gases, is positioned around the valve stem 116, and it is sealed at the top and bottom to separate the valve stem and associated seals in a vacuum-tight manner from the valve chamber 110 so that a vacuum in the valve chamber 110 is not compromised by exposure of the evacuated valve chamber 110 to the pneumatic air or other fluid in the pneumatic piston cylinder 129 that drives the pneumatic piston 130. Depending on a particular valve structure, other valve actuator components may also be separated or isolated by the bellows 128 in a vacuum-tight manner from the valve chamber 110. For example, the springs 114 in the example valves 12, 14, 16 are surrounded by the bellows 128, but such isolation of the spring 114 from the vacuum in the valve chamber 110 by the bellows 128 is not required.

The bellows 128 is expandable and contractible longitudinally so that it can accommodate the upward and downward movement of the valve stem 116 without losing the vacuum-tight seal. The bellows 128 is made of a material that is impervious to air or other gas that is used to operate the pneumatic piston 130, and, as is typical in isolation valves used in CVD systems, the bellows 128 may be made of stainless steel in order to resist corrosive effects of etchant and other corrosive gases that flow through such isolation valves in such systems. However, in order to provide the flexibility necessary to accommodate the upward and downward movement of the valve stem 116, as explained above, the stainless steel bellows 128 has to be fairly thin, for example, about 0.006 inch, in some applications. As explained in U.S. Pat. No. 8,196,893, which is incorporated herein by reference, some etch gases, for example, $NF_3$; $CF_4$, and others, can corrode through 0.006 inch, 321 or 316 stainless steel bellows in as little time as three months of ordinary CVD wafer process operation and in situ cleaning cycles. If holes should get corroded through the stainless steel bellows 128, the impermeable, vacuum-tight seal provided by the bellows 128 to maintain the vacuum in the valve chamber 110 would be breached. Such a breach would not only make it difficult to create and maintain the required vacuum, but it would also expose the valve chamber 110 to the atmosphere and to contamination. Such contamination could migrate upstream into the reaction chamber 44 (FIG. 7) and contaminate and potentially degrade or ruin thin film coatings 40 being deposited in the reaction chamber 44 by the CVD process. Therefore, the entire CVD deposition system would have to be shut down and taken out of service while the manifold isolation valve assembly 10 is removed and disassembled to repair or replace the isolation valve or valves 12, 14, 16 that have such corroded bellows 128. Also, the seals and other valve actuator components would be vulnerable to attack by the etch gases as well as by the reaction byproduct and unreacted process gases.

As mentioned above, the isolation valve in U.S. Pat. No. 8,196,893 describes a protective cup-shaped shield around the bellows to isolate the bellows from the valve chamber when the isolation valve is open to allow flow of corrosive gases through the valve. However, that cup-shaped shield in U.S. Pat. No. 8,196,893 moves up and down with the valve stem, so it does not isolate the bellows from the valve chamber when the valve is closed. While that protective shield in U.S. Pat. No. 8,196,893 is generally effective for protecting the bellows in some applications, it would not be effective to protect the bellows of a closed isolation valve that is positioned along with an open isolation valve in a common valve chamber through which a corrosive gas is flowing.

As best seen in FIGS. 5 and 6, each of the example isolation valves 12, 14, 16 in the example manifold isolation valve assembly 10 includes an expandable and contractible shield 20, which surrounds the bellows 128 and encloses a space in which the bellows 128 is positioned to protect the bellows 128 from particles or corrosive gas that may be in a fluid that flows through the valve chamber 110. To avoid unnecessary clutter in FIG. 5 and redundancy in this description, the shield 20 is described primarily in reference to the middle valve 14, of which FIG. 6 is an enlarged cross-section view, with the understanding that this description is also applicable to the other valves 12, 16 in the example manifold isolation valve assembly 10. The shield 20 extends from the manifold valve body 26 or a part of the manifold valve body 26, e.g., from the bonnet 142, downwardly to the valve closure member 118 or to the valve stem 116 of the valve closure member 118, and it is expandable and contractible longitudinally in relation to the longitudinal axis 150 to accommodate upward and downward movement of the valve stem 116 and closure member 118 as well as to accommodate the longitudinal expansion and contraction of the bellows 128. Therefore, the shield 20 expands as the respective closure member is moved toward the respective outlet port and contracts as the respective closure member is moved away from the respective outlet port. The shield 20 in this example is telescopically expandable and contractible as will be described in more detail below, although other expandable and contractible shield structures could also be used. In this example, the shield 20 comprises a stationary cylindrical shield section 140 that is sealed to, and extends downwardly from, the valve bonnet 142 around the bellows 128 toward, but not all the way to, the valve closure member 118. A movable cylindrical shield section 144 extends upwardly from the valve closure member 118 around the bellows 128 and around the stationary shield section 140 toward, but not all the way to, the bonnet 142. An optional guide ring 146 is shown mounted on the inside annular surface 145 of the movable shield section 144 and extends radially inward to a slidable contact with the juxtaposed outside annular surface 141 of the stationary shield section 140.

Figure 18:
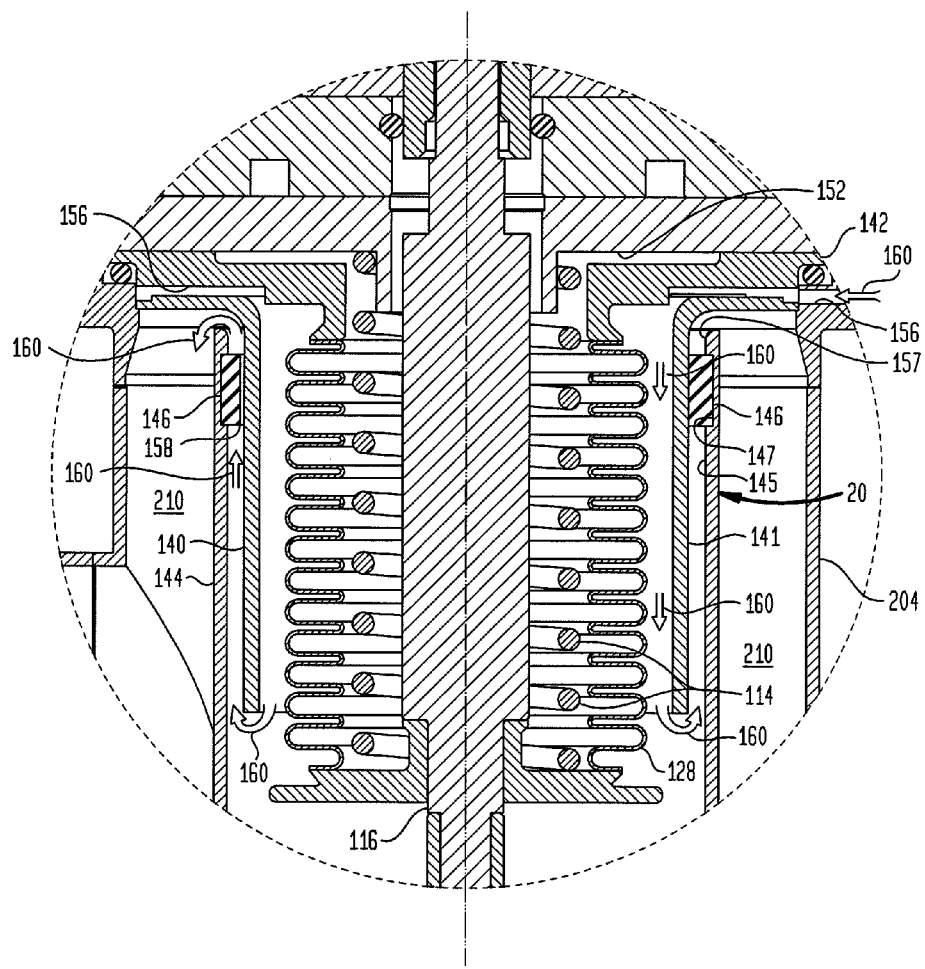
FIG. 18 is an enlargement of a portion of the isometric cross-section view of FIG. 14 to illustrate several details of the corrosion and deposition protected isolation valve.

Therefore, as the valve closure member 118 moves upwardly and downwardly to open and close the valve 14, the movable shield section 144 moves upwardly and downwardly in relation to the stationary shield section 140 with the guide ring 146 sliding upwardly and downwardly on the outside annular surface 141 of the stationary shield 140. Both the stationary shield section 140 and the movable shield section 144 are made of a material that is impervious to gas and is corrosion resistant to prevent corrosive gases flowing in the valve chamber 110 from reaching the bellows 128. For example, but not for limitation, the stationary shield section 140 and the movable shield section 144 can be made of stainless steel that is thicker than the thin stainless steel of the bellows 128 so that they are more durable against the corrosive gases that flow through the valve chamber 110 than the bellows 128. The guide ring 146 can be made of a material that has a low coefficient of friction to slide easily on the stationary shield section 140, but which is also chemically resistant to corrosive effects of corrosive gases in the valve chamber 110. For example, the guide ring 142 in this example valve 14 can be made of Teflon™ or similar material. The guide ring 142 is mounted and sealed in an annular groove 147 in the inside surface 145 of the movable shield section 144 (see FIG. 18 for an enlarged view), so that the guide ring 146 remains securely mounted on the movable shield section 144 as it moves upwardly and downwardly in relation to the stationary shield section 140. To ensure that no corrosive gas from the valve chamber 110 seeps between the guide ring 146 and the stationary shield section 140, the interior space enclosed by the shield 20 can be pressurized with a gas, for example, an inert gas, such as nitrogen, argon, or any other gas, to a pressure that is greater than the pressure in the valve chamber 110, as will be described in more detail below. In some applications, the optional guide ring 146 may not be required.

As mentioned above, the example isolation valves 12, 14, 16 can all be the same, so description of one of them can apply to all of them. Also, any of the example isolation valves 12, 14, 16 can be implemented in a single isolation valve embodiment 200, as illustrated in FIGS. 8-18, wherein the example isolation valve 14 is illustrated mounted in a single valve body 204 that encloses a single valve chamber 210 and has an inlet port 224, an outlet port 234, and an annular valve seat 226 upstream from the outlet port 234. For convenience and to avoid clutter in the drawings, further description of various details of the example isolation valve 14 is made with reference to the example isolation valve 14 shown mounted in the single isolation valve embodiment 200 in FIGS. 8-18 with the understanding that such description of the isolation valve 14 in the single isolation valve embodiment 200 is also applicable to the example isolation valves 12, 14, 16 in the manifold isolation valve assembly 10 in FIGS. 1-6. Also, for continuity and to avoid confusion, reference numbers in this description to components, parts, and features in the example isolation valve 14 in the single valve embodiment 200 in FIGS. 8-18 are the same as comparable components, parts, and features in the example isolation valve 14 in the manifold isolation valve assembly 10 in FIGS. 1-6.

Figure 9:
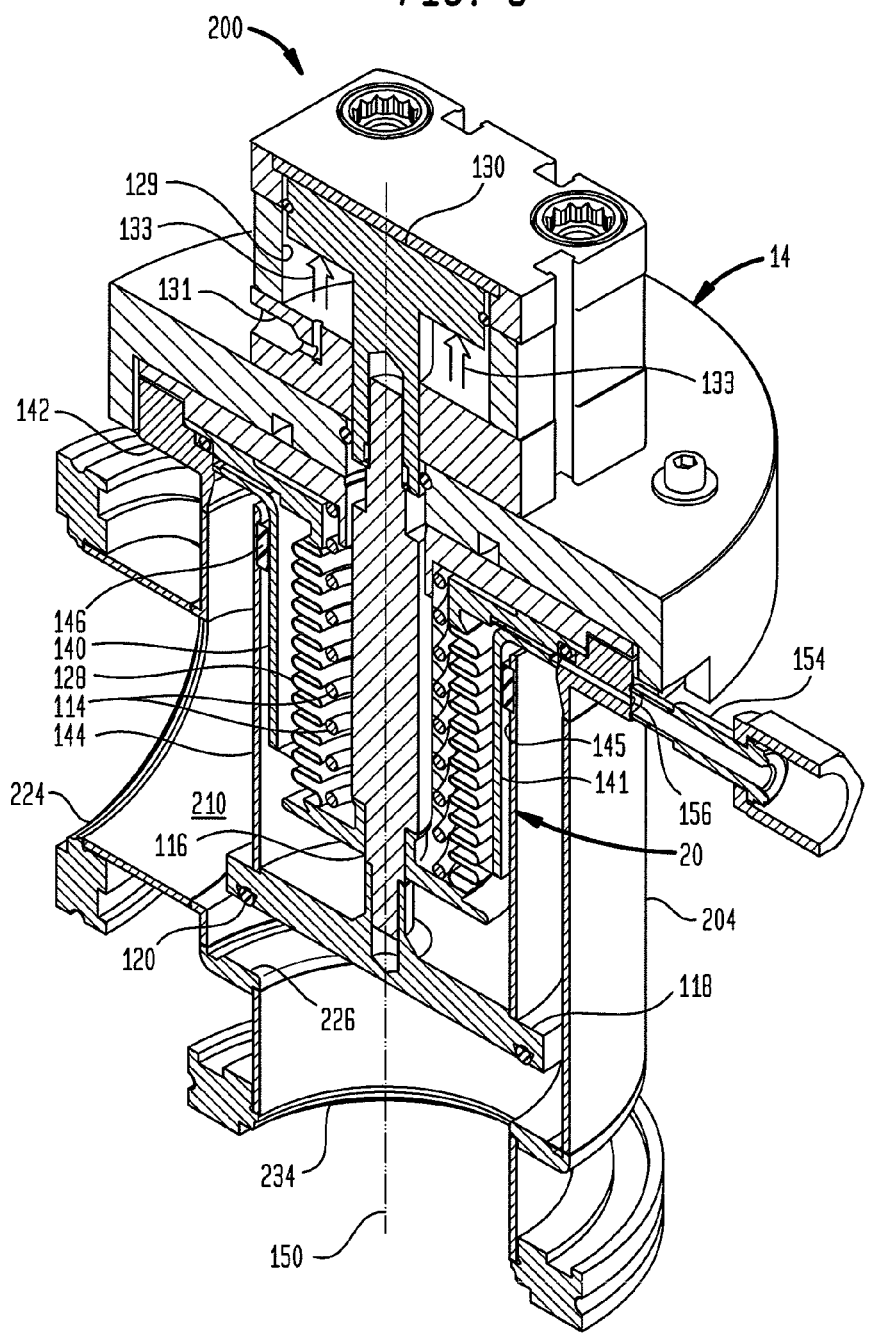
FIG. 9 is an isometric cross-section view of the example single isolation valve embodiment of FIG. 8 with the valve closure member illustrated in open mode.
Figure 10:
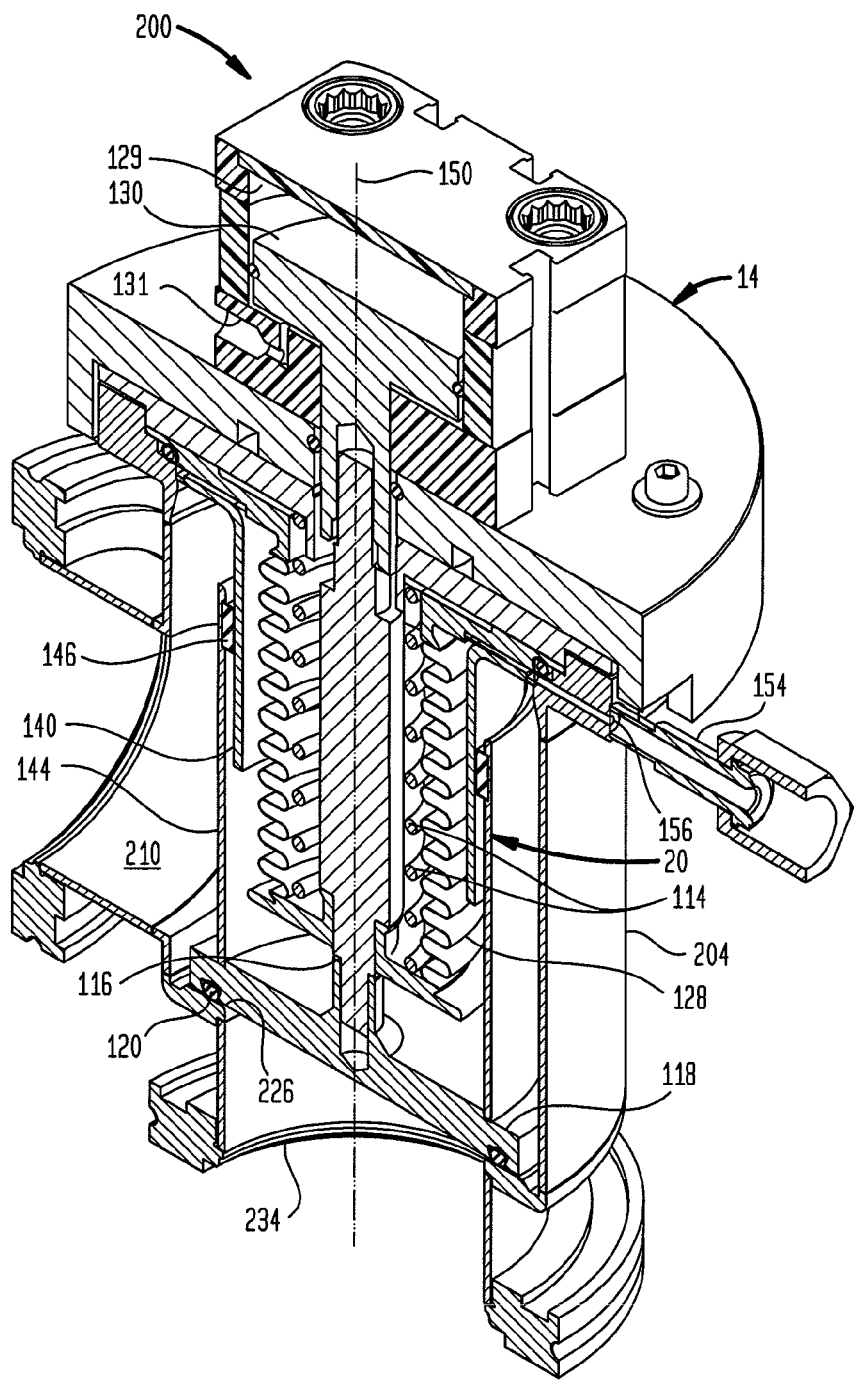
FIG. 10 is an isometric cross-section view of the example single isolation valve embodiment similar to FIG. 9, but illustrating the valve closure member in closed mode.
Figure 11:
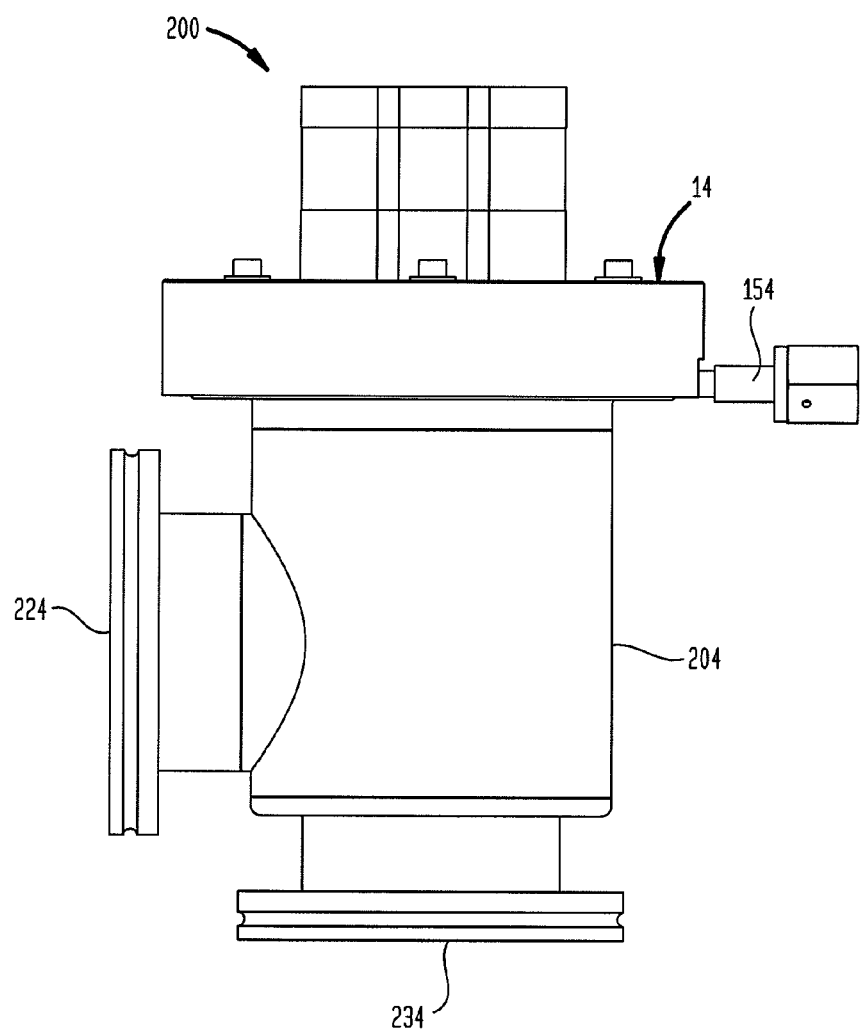
FIG. 11 is a side elevation view of the example single isolation valve embodiment of FIG. 8.
Figure 12:
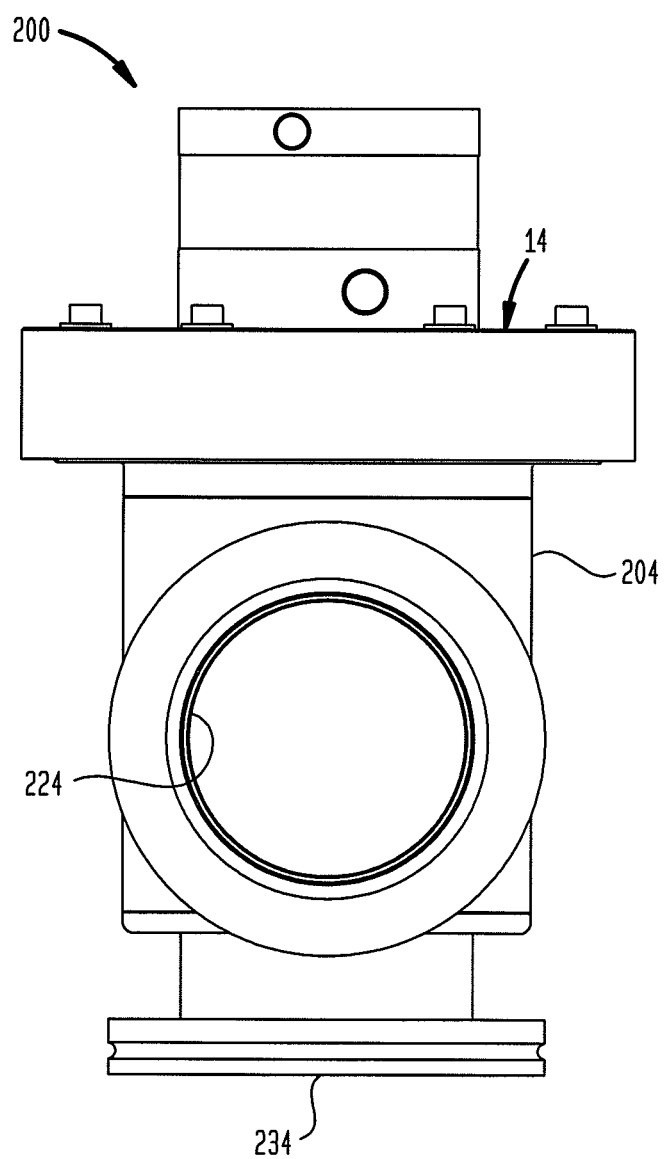
FIG. 12 is a front elevation view of the example single isolation valve embodiment of FIG. 8.
Figure 13:
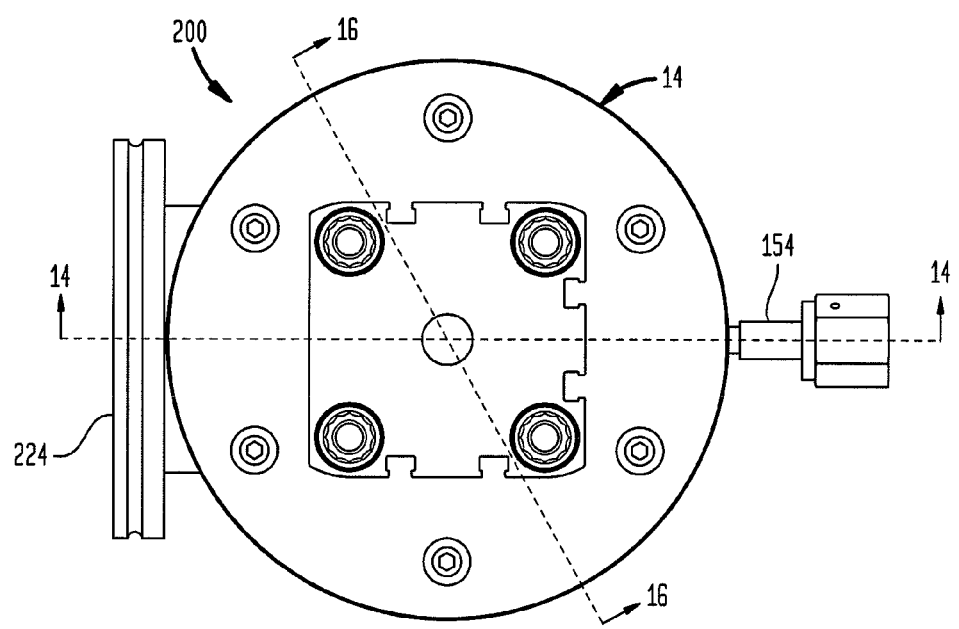
FIG. 13 is a top plan view of the example single isolation valve embodiment of FIG. 8.
Figure 14:
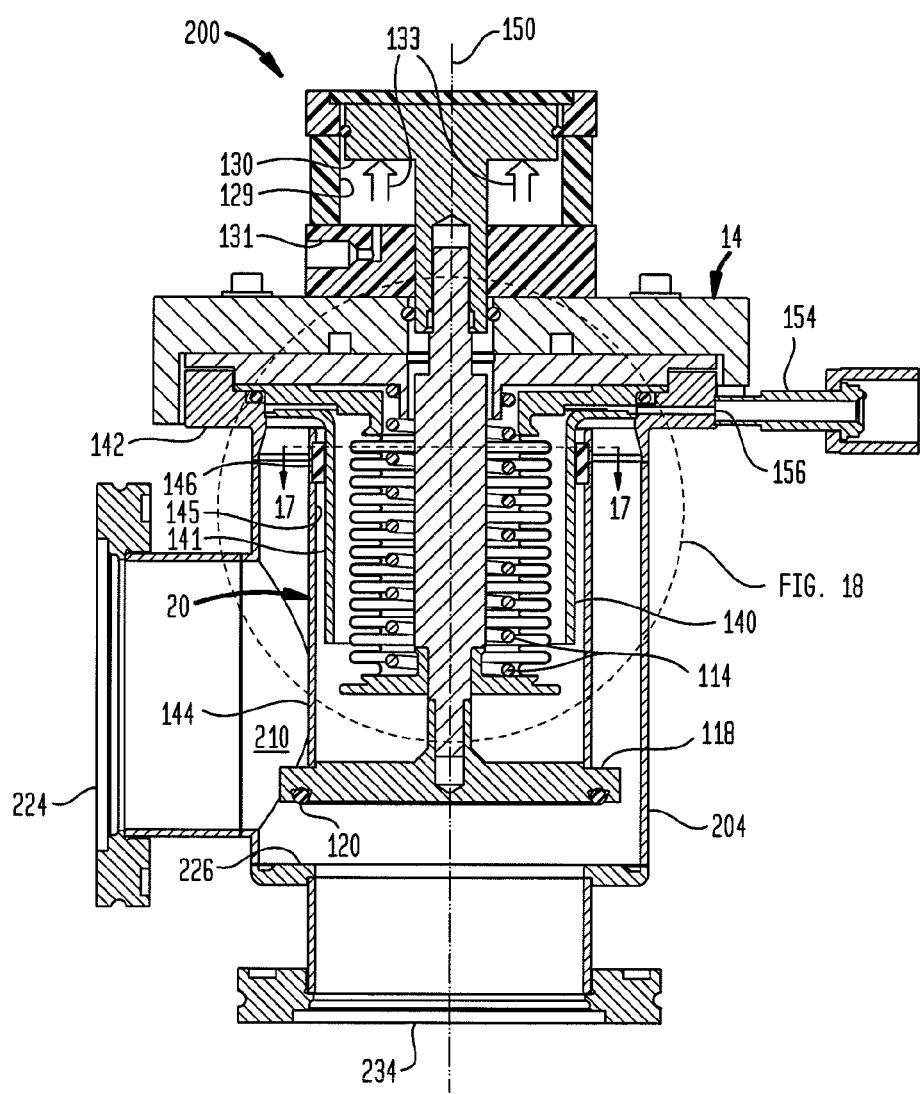
FIG. 14 is a cross-section view of the example single isolation valve embodiment taken along the cross-section line 14-14 in FIG. 13 with the valve closure member illustrated in open mode.
Figure 15:
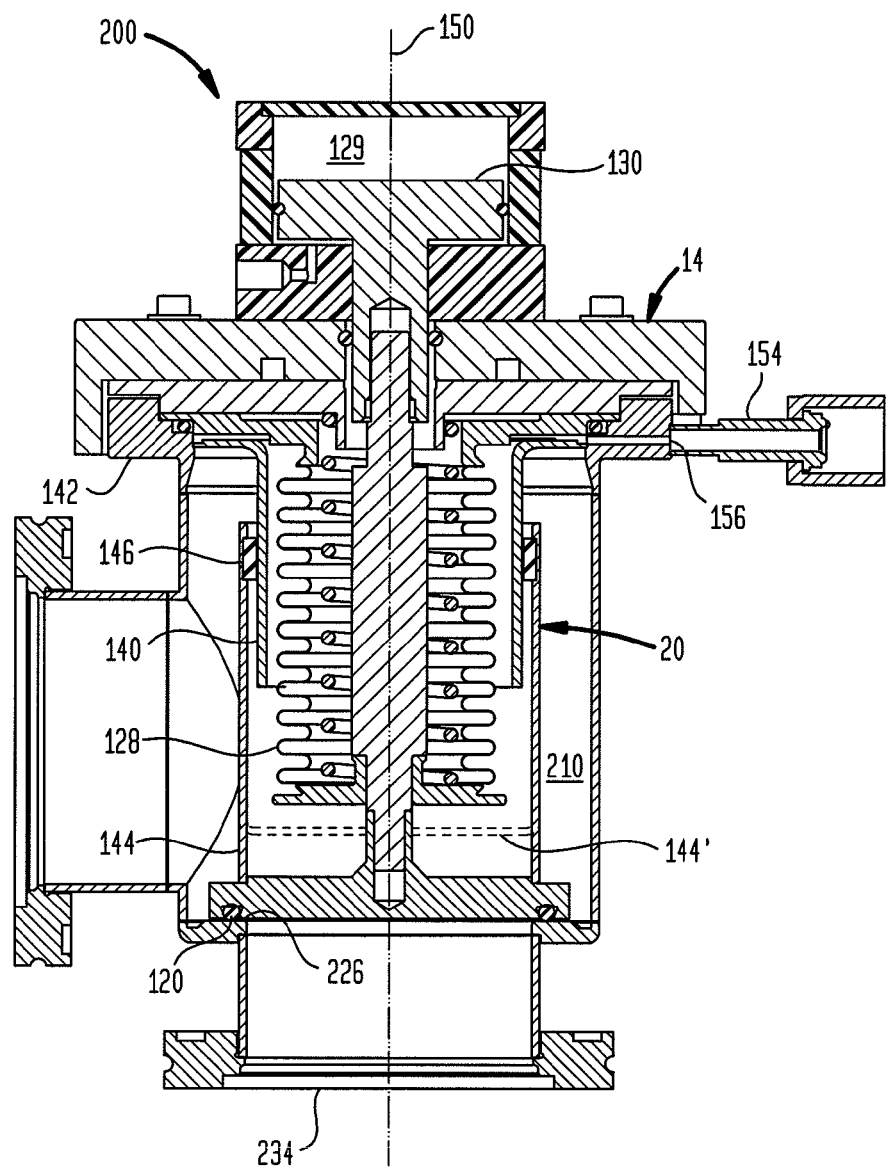
FIG. 15 is a cross-section view of the example single valve embodiment in the same cross-section plane as FIG. 14, but with the valve closure member illustrated in closed mode.
Figure 16:
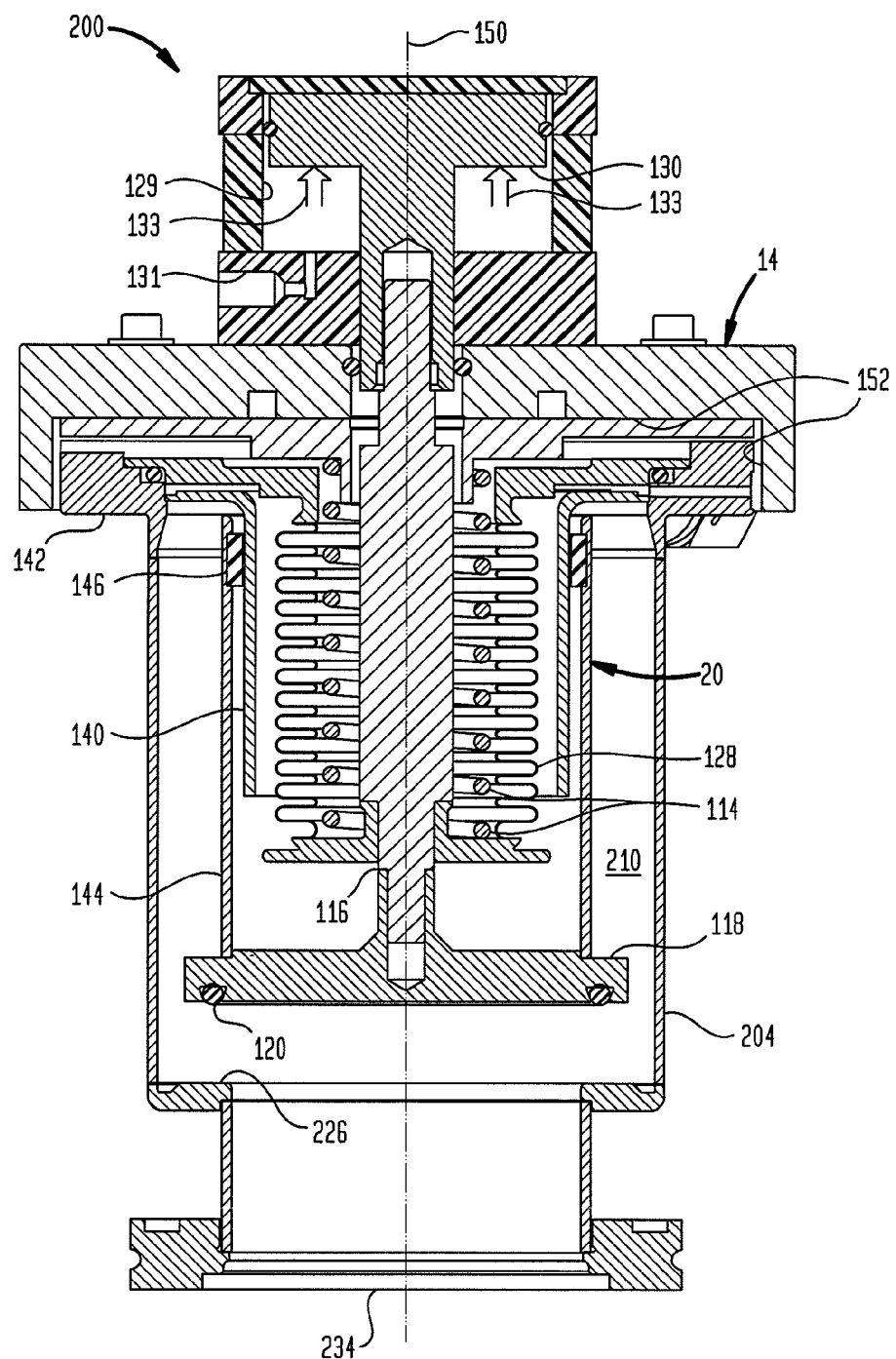
FIG. 16 is a cross-section view of the example single valve embodiment taken along the cross-section line 16-16 in FIG. 13.

Therefore, referring now primarily to FIGS. 9, 14, and 16, when air or other gas pressure is directed through the port 131 into the pneumatic cylinder 129, the pneumatic pressure in the cylinder 129 applies a pneumatic force 133 on the piston 130 to push the piston 130 upwardly, away from the valve seat 226 with enough force to overcome the compression force of the spring 114 on the valve stem 116 to thereby move the valve stem 116 and the valve closure member 118 upwardly, away from the valve seat 226 to open the valve. Removal of the pneumatic pressure from the piston 130 allows the compression spring 114 to force the valve stem 116 and valve closure member 118 back down onto the valve seat 226 to close the valve as illustrated in FIGS. 10 and 15. The valve seal 120 on the valve closure member 118 gets squeezed between the valve closure member 118 and the valve seat 226 to seal the valve closed. The above-described upward and downward movement of the valve stem 116 and valve closure member 118 causes the bellows 128 to contract and expand longitudinally along the longitudinal axis 150 of the valve 14. The contraction and expansion of the bellows 128 changes the volume of the space enclosed by the bellows 128, so an air duct 152 connecting the space enclosed by the bellows 128 to the outside atmosphere as best seen in FIG. 16 is provided by appropriate grooves or holes in the valve bonnet 142 components to prevent air in the space enclosed by the bellows 128 from compressing and decompressing as the valve stem 116 and closure member 118 move upwardly and downwardly which would inhibit quick and deficient valve operation.

As also mention above, as the valve closure member 118 moves upwardly and downwardly to open and close the valve, the movable cylindrical shield section 144 of the telescopically expandable and contractible shield 20 moves upwardly and downwardly in relation to the stationary cylindrical shield section 140, with the guide ring 146 mounted in the movable shield section 144 sliding upwardly and downwardly on the external surface 141 of the stationary shield section 140. The top of the stationary shield section 140 is sealed, e.g., by welding, to the bonnet 142, and the bottom of the movable shield section 144 is sealed, e.g., by welding, to the closure member 118 to prevent corrosive and other gases in the valve chamber 210 (or in the common valve chamber 110 in the manifold 26 of FIG. 1-6) from entering the space enclosed by the shield 20, i.e., by the stationary and movable shield sections 140, 144, to protect the bellows 128 in that space from such gases. As also mentioned above, an optional positive (higher) pressure of gas can be maintained in the space enclosed by the shield 20 to prevent leakage of corrosive and other gases or gas-borne particles from the valve chamber 210 (or in the common valve chamber 110 in the manifold 26 of FIGS. 1-6) around or through the guide ring 146 and into the space enclosed by the shield 20. As best seen in FIGS. 14-18, the gas to provide such positive pressure can be directed from a positive (higher) pressure gas supply (not shown) into the space enclosed by the shield 20, for example, via a fitting connection 154 (see FIGS. 1, 3, 4, 6, 8-11, 13-15, and 18) and gas duct 156 (see FIGS. 6, 9, 10, 14, 15, and 18) in the valve bonnet 142.

Figure 17:
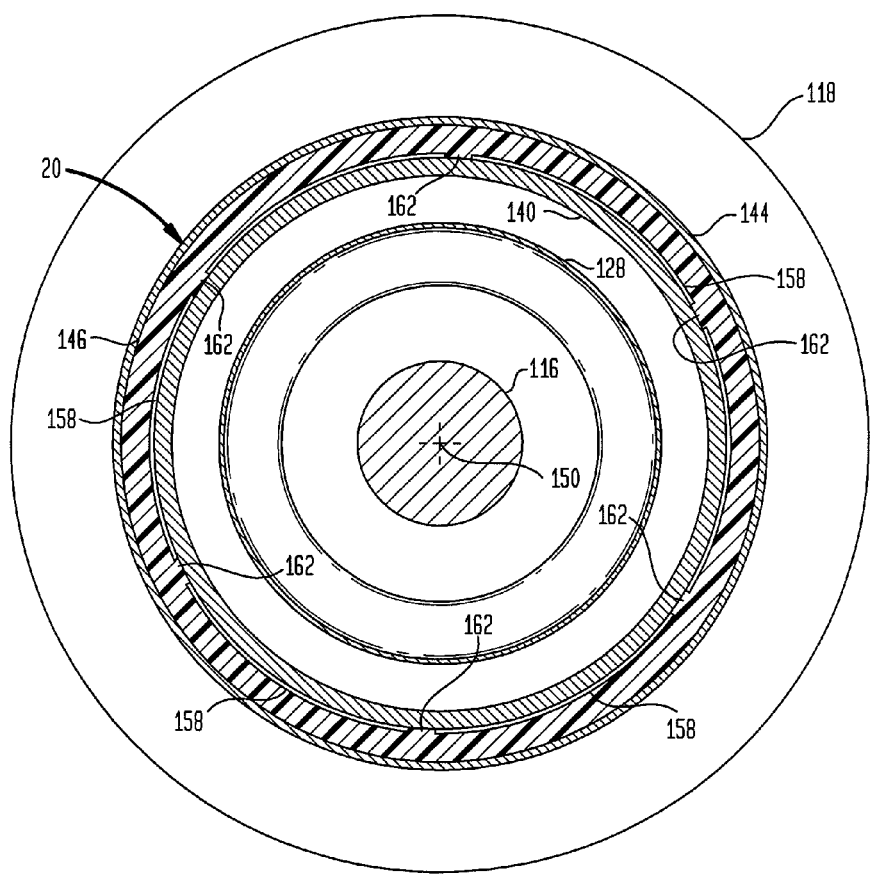
FIG. 17 is an enlarged cross-section view of an example corrosion and deposition protected isolation valve taken along the cross-section line 17-17 in FIG. 14.

Some gases in effluents from CVD processes condense and/or react together to deposit solids on surfaces, which can accumulate on inside surfaces of forelines, valves, and other components downstream from the reaction chamber (FIG. 7). Such condensation or deposition, especially of solid materials, on the outside surface of the stationary shield section 140 could interfere with, and eventually clog or stop the sliding movement of the guide 146 on the stationary shield section 140 or cause damaging wear and degradation of the guide 146 if not mitigated. In the example isolation valve 14, such mitigation can be provided, for example as illustrated in FIGS. 14-18, by blowing the positive (higher) pressure gas from the fitting connection 154 and gas duct 156 through the interior space enclosed by the shield 20 and through the annular opening 157 between the stationary and movable shield sections 140, 144 as indicated by the gas flow arrows 160 in FIG. 18. A narrow annular gap 158 between the guide ring 146 and the outside surface 141 of the stationary shield section 140 can facilitate and enhance such mitigation as explained below. As best seen in FIG. 17, the gap 158 is annular, extending almost entirely around the peripheral surface of the stationary shield section 140 and interrupted only by several narrow bosses 162 on the guide ring 146 that extend into sliding contact with the interfacing annular surface 141 of the stationary shield section 140 to maintain alignment between the stationary and movable shield sections 140, 144. The narrow gap 158 functions as an annular nozzle that directs the positive (higher) pressure gas flow 160 rushing through the gap 158 as an annular jet stream along the outside annular surface 141 of the stationary shield section 140 above the guide ring 146 to keep the lower pressure gases in the valve chamber 210 (or common valve chamber 110 in the manifold 26 in FIGS. 1-6) away from that exposed outside annular surface 141 of the stationary shield section 140. Therefore, that annular jet of gas inhibits deposition or condensation of solid materials on the exposed portion of the annular surface 141 of the stationary shield section 140 that interfaces with the sliding guide ring 146 of the movable shield section 144.

Figure 19:
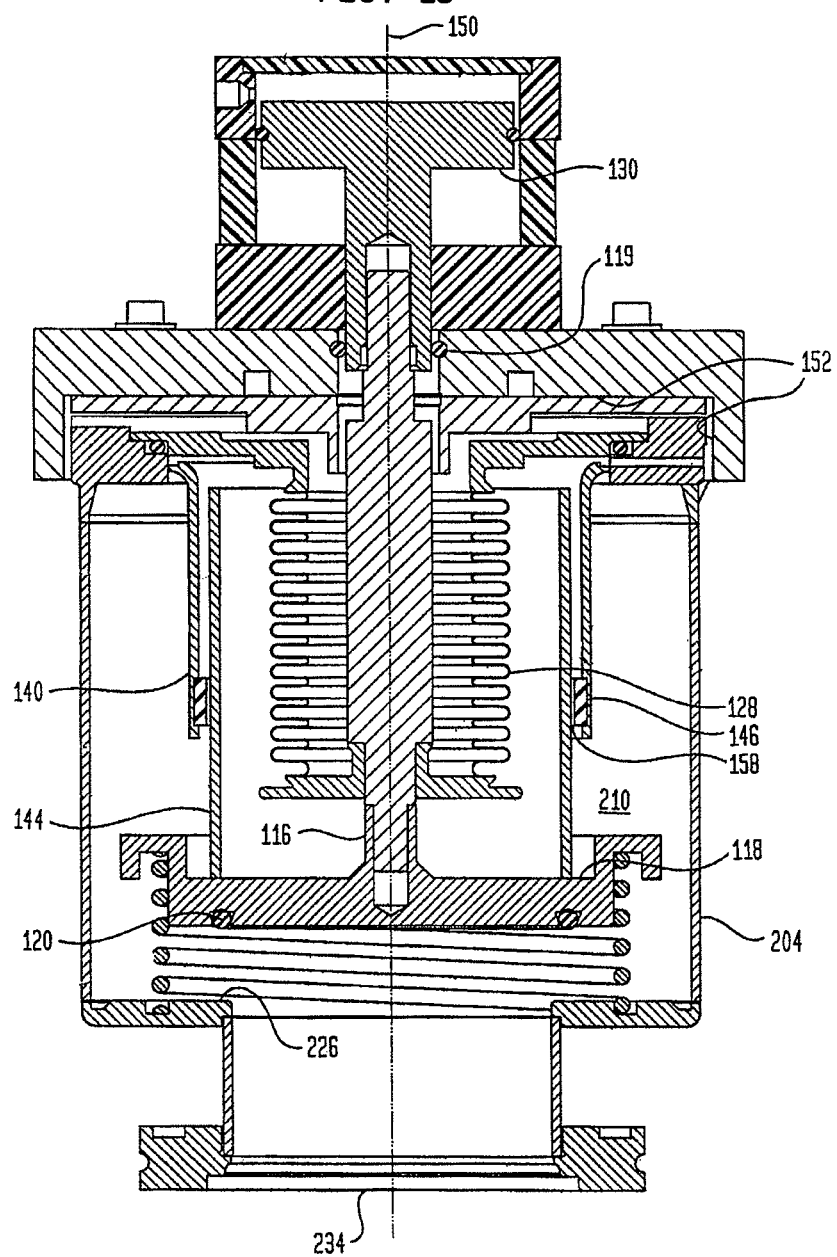
FIG. 19 is a cross-section view similar to FIG. 16, but illustrating the stationary shield section as being outside of the movable shield section.

Of course, persons skilled in the art will recognize that the guide ring 146 could be mounted in the stationary shield section 140 instead of in the movable shield section 144 so that the inside surface of the movable shield section 144 would slide on the guide ring 146 as the valve opens and closes. Alternatively, the guide ring 146 may not be needed. If the shield sections 140, 144 are sized to provide an appropriately-sized annular opening 157 between them to function as an annular nozzle, and if the gas in the space inside the shield sections 20 is provided with enough pressure and flow volume, a sufficient annular jet of gas can be provided through the annular opening 157 to inhibit solid deposition materials from forming on the shield 20 surfaces. Also, the movable shield section 144 could attached in an impervious manner to the valve stem 16 instead of to the closure member 118 as illustrated by phantom lines 144' in FIG. 15. Also the stationary shield section 140 could be sized and positioned to be outside of the movable shield section 144 instead of inside. Such modifications would be so minimal and easily within the capabilities of persons skilled in the art, once they understand the apparatus and function of the shield 20 as described herein that it is not necessary to illustrate them in additional drawing views. However, as an example, the stationary shield section 140 is illustrated in FIG. 19 as being outside of the movable shield section 144.

Besides stainless steel, the shield sections 140, 144 can be made with other materials that are resistant to various corrosive gases or other fluids that may be flowed through the valve chamber 110 in FIG. 1-6 or 210 in FIGS. 8-19. For example, but not for limitation, aluminum (Al) initially reacts with $NF_3$ to form a dense aluminum fluoride ($AlF_3$) layer, which protects the remaining aluminum material from further reaction. Therefore, in systems wherein $NF_3$ is used as an etchant gas, it may be beneficial for the shield sections 140, 144 to be aluminum, so that it does not corrode in the presence of the $NF_3$ etchant gas flowing through the valve 10, which will enable it to protect the thin, stainless steel bellows 128 from attack by the $NF_3$. On the other hand, if, for example, $CF_4$ is used as the etchant gas, a different material that is more resistant to reaction with $CF_4$, for example, Hastalloy™, a highly corrosion-resistant metal alloy by Haynes International, Inc., of Kokomo, Ind., can be used for the shield sections 140, 144. Other materials that are considered to be corrosion resistant include titanium, nickel, Inconel™, and others that are known to persons skilled in the art.

The foregoing description provides examples that illustrate the principles of the invention, which is defined by the claims that follow. Since numerous insignificant modifications and changes will readily occur to those skilled in the art once they understand the invention, it is not desired to limit the invention to the exact example constructions and processes shown and described above. Accordingly, resort may be made to all suitable combinations, sub-combinations, modifications, and equivalents that fall within the scope of the invention as defined by the claims. The words "comprise," "comprises," "comprising," "include," "including," and "includes" when used in this specification, including the claims, are intended to specify the presence of stated features, integers, components, or steps, but they do not preclude the presence or addition of one or more other features, integers, components, steps, or groups thereof. The terms upper, upwardly, lower, bottom, top, down, downwardly, vertical, horizontal, and other directional terms in this description and the following claims are in reference to the diagrammatic orientations depicted in the drawings and are only used for convenience and clarity in this description unless otherwise indicated. They are not intended to limit the example valve assembly 10 or valves 12, 14, 16 or single valve embodiment 200 to any particular orientation in real use applications, and, in fact, the corrosion and deposition protected isolation valves can be positioned and used in any desired orientation.

The invention and several embodiments in which an exclusive property or privilege is claimed are defined as follows:

1. Manifold valve apparatus for selectively directing a fluid flowing in a foreline to a plurality of foreline branches, comprising:
   a manifold valve body enclosing a manifold valve chamber, wherein said valve body has an inlet port adapted for fluid-flow connection to the foreline for conducting a flow of fluid into the manifold valve chamber and a plurality of outlet ports adapted for fluid-flow connection to respective foreline branches for conducting flow of fluid out of the manifold valve chamber;
   a plurality of closure members, each of which closure members is positioned in the manifold valve chamber between the inlet port and a respective one of the outlet ports and is movable back and forth between (i) an open position in which the closure member allows fluid in the manifold valve chamber to flow through the respective outlet port and out of the valve chamber and (ii) a closed position in which the closure member prevents fluid flow through the outlet port;
   actuator apparatus for each of the closure members for moving each of the closure members respectively back and forth between the open position for the respective closure member and the closed position for the respective closure member, the actuator apparatus being of a type comprising a piston for applying a force to move the closure member in one direction, a spring for applying a force to move the closure member in an opposite direction, and a bellows positioned to isolate the manifold valve chamber with an vacuum-tight seal from the piston;
   a plurality of expandable and contractible shields positioned in the valve chamber in a manner such that at least the bellows of each actuator apparatus is surrounded by one of the expandable and contractible shields in a manner that separates at least the bellows from gases flowing in the valve chamber and encloses a space around the bellows; and
   a plurality of gas ducts that are connectable to a positive pressure gas supply outside of the valve chamber and extend to respective ones of the spaces around the respective bellows that are enclosed by the respective expandable and contractible shields for directing positive pressure gas into the spaces around the bellows that are enclosed by the expandable and contractible shields to maintain the spaces at a pressure higher than a pressure in the valve chamber outside of the shields.

2. The manifold valve apparatus of claim 1, wherein each of said shields comprises a stationary shield section that extends from a portion of the manifold valve body around the bellows toward but not all the way to the closure member, and a movable shield section that extends from the closure member to interface in a movable manner with an outside surface or an inside surface of the stationary shield section and such that the movable shield section is movable reciprocally in relation to the stationary shield section.

3. The manifold valve apparatus of claim 2, wherein there is an annular opening between juxtaposed surfaces of the stationary shield section and the movable shield section and wherein the space enclosed by the shield around the bellows is pressurizable through a respective one of the gas ducts with a sufficient pressure and volume of inert or other gas to create an annular jet flow of inert or other gas from the space inside the shield and through the annular opening to the valve chamber outside of the shield with sufficient force to keep lower pressure gases in the valve chamber away from an outside surface of the shield.

4. The manifold valve apparatus of claim 3, including a guide ring positioned between the stationary and movable shield sections.

5. The manifold valve apparatus of claim 4, wherein the guide ring includes a plurality of bosses that slide on an interfacing surface of one of the shield sections.

6. The manifold valve apparatus of claim 3, wherein the guide ring provides a gap that forms an annular nozzle between an annular surface of the guide ring and the adjacent juxtaposed surface of the shield section.

7. The manifold valve apparatus of claim 1, wherein the bellows is sealed vacuum tight between the manifold valve body and the closure member, and wherein the shield isolates the bellows from the manifold valve chamber to prevent contact between the bellows and fluid flowing through the manifold valve chamber.

8. The manifold valve apparatus of claim 7, wherein: (i) each of the pistons is positioned in a respective cylinder housing mounted on a respective bonnet mounted on the manifold valve body and is connected to a respective piston rod that extends from the respective piston in the respective cylinder housing, through an aperture in the respective bonnet, and to the respective closure member in the manifold valve chamber; (ii) the respective bellows associated with each piston is sealed in a vacuum-tight manner to the respective bonnet and to the respective valve stem or closure member in the valve chamber; and (iii) the respective expandable and contractible shield is positioned in the manifold valve chamber around the respective bellows in a manner that isolates the bellows from gas flowing in through the manifold valve chamber from the inlet port to any of the outlet ports, said expandable and contractible shield being attached to and extending down from the respective bonnet and to the respective closure member or valve stem such that the respective expandable and contractible shield expands as the respective closure member is moved toward the respective outlet port and contracts as the respective closure member is moved away from the respective outlet port.

9. Valve apparatus, comprising:
   a valve body enclosing a valve chamber, wherein said valve body has an inlet port for flow of fluid into the valve chamber and an outlet port for flow of fluid out of the valve chamber;

a closure member positioned in the valve chamber between the inlet port and the outlet port, said closure member being movable back and forth between (i) an open position in which the closure member allows fluid flow from the inlet port and through the outlet port out of the valve chamber and (ii) a closed position in which the closure member prevents fluid flow through the outlet port;

actuator apparatus comprising a pneumatic piston for applying a force to move the closure member to the opened position, a spring for applying a force to move the closure member to the closed position, and a bellows positioned to isolate the piston with a vacuum-tight seal from the valve chamber;

an expandable and contractible shield positioned around at least the bellows in a manner that separates the bellows from gases flowing in the valve chamber and encloses a space around the bellows; and a gas duct that is connectable to a positive pressure gas supply outside of the valve chamber and extends to the space around the bellows that is enclosed by the expandable and contractible shield for directing positive pressure gas into the space around the bellows that is enclosed by the expandable and contractible shield to maintain the space at a pressure higher than a pressure in the valve chamber outside of the shield.

10. The valve apparatus of claim 9, wherein said shield comprises a stationary shield section that extends from a portion of the valve body around the actuator apparatus toward but not all the way to the closure member, and a movable shield section that extends from the closure member to interface in a movable manner with the outside or the inside of the stationary shield section and such that the movable shield section is movable reciprocally in relation to the stationary shield section.

11. The valve apparatus of claim 10, wherein there is an annular opening between juxtaposed surfaces of the stationary shield section and the movable shield section and wherein the space enclosed by the shield around the bellows is pressurizable through the gas duct with a sufficient pressure and volume of inert or other gas to create an annular jet flow of inert or other gas from the space inside the shield and through the annular opening to the valve chamber outside of the shield with sufficient force to keep lower pressure gases in the valve chamber away from an outside surface of the shield.

12. The valve apparatus of claim 11, including a guide ring positioned between the stationary and movable shield sections.

13. The valve apparatus of claim 12, wherein the guide ring includes a plurality of bosses that slide on an interfacing surface of one of the shield sections.

14. The valve apparatus of claim 11, wherein the guide ring provides a gap that forms an annular nozzle between an annular surface of the guide ring and the adjacent juxtaposed surface of the shield section.

15. In a valve that has a valve chamber enclosed by a valve body with an inlet port and an outlet port that accommodates fluid flow through the valve chamber from the inlet port to the outlet port, a closure member in the valve chamber that is movable between an open position and a closed position, an actuator connected to the closure member for moving the closure member between closed and open positions, and a bellows separating the actuator from the fluid flow chamber with a vacuum-tight seal to the closure member and to the valve body, a method of protecting the bellows from particles or corrosive gas flow through the valve chamber, comprising:

preventing the particles or corrosive gas that flow through the valve chamber from entering a space in the valve chamber in which the bellows is positioned by providing an expandable and contractible shield around the space in which the bellows is positioned and maintaining a greater pressure in the space surrounded by the shield than a pressure in the valve chamber outside of the shield by directing a positive pressure flow of inert gas or air from outside of the valve body into the space that is surrounded by the shield.

16. The method of claim 15, including positioning the expandable and contractible shield in a position in the valve chamber that encloses the space in which the bellows is positioned inside with the expandable and contractible shield and that does not inhibit the fluid flow in the valve chamber outside the expandable and contractible shield from the inlet port to the outlet port.

17. The method of claim 16, including providing the expandable and contractible shield by extending a stationary shield portion from a portion of the valve body around the actuator toward but not all the way to the closure member and extending a movable shield portion from the closure member toward but not all the way to the portion of the valve body around the actuator and in telescopically sliding relation to the stationary shield portion so that movement of the closure member toward and away from the outlet port causes expansion and contraction, respectively, of the expandable and contractible shield by moving the movable shield portion reciprocally in relation to the stationary shield portion.

18. The method of claim 17, including positioning the movable shield portion outside of the stationary shield portion such that an inside surface of the movable shield portion slides along an outside surface of the stationary shield portion.

19. The method of claim 17, including positioning the movable shield portion inside of the stationary shield portion such that an outside surface of the movable shield portion slides along an inside surface of the stationary shield portion.

20. The method of claim 17, including providing an annular gap between the movable shield portion and the stationary shield portion to create an annular jet of the inert gas or air flowing from the annular gap adjacent respective juxtaposed surfaces of the movable shield portion and the stationary shield portion to blow particles or corrosive gas in the fluid flow in the valve chamber away from the surfaces of the movable shield portion and the stationary shield portion.

21. Valve apparatus comprising:
a valve chamber enclosed by a valve body with an inlet port and an outlet port that accommodates fluid flow through the valve chamber from the inlet port to the outlet port;
a closure member in the valve chamber that is movable between an open position and a closed position;
an actuator connected to the closure member for moving the closure member between closed and open positions;
a bellows separating the actuator from the fluid flow chamber with a vacuum-tight hermetic seal to the closure member and to the valve body;
an expandable and contractible shield enclosing a space in the valve chamber in which the bellows is positioned; and
means for providing and maintaining a positive pressure in the space in the valve chamber enclosed by the expandable and contractible shield in which the bellows is positioned that is greater than a pressure in the valve chamber outside of the expandable and contractible shield.

* * * * *